United States Patent
Yakubo et al.

(10) Patent No.: US 11,948,945 B2
(45) Date of Patent: Apr. 2, 2024

(54) SEMICONDUCTOR DEVICE AND WIRELESS COMMUNICATION DEVICE WITH THE SEMICONDUCTOR DEVICE

(71) Applicant: SEMICONDUCTOR ENERGY LABORATORY CO., LTD., Atsugi (JP)

(72) Inventors: Yuto Yakubo, Kanagawa (JP); Hitoshi Kunitake, Kanagawa (JP); Takayuki Ikeda, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 199 days.

(21) Appl. No.: 17/611,689

(22) PCT Filed: May 18, 2020

(86) PCT No.: PCT/IB2020/054665
§ 371 (c)(1),
(2) Date: Nov. 16, 2021

(87) PCT Pub. No.: WO2020/240331
PCT Pub. Date: Dec. 3, 2020

(65) Prior Publication Data
US 2022/0199653 A1    Jun. 23, 2022

(30) Foreign Application Priority Data

May 31, 2019  (JP) .................................. 2019-102035
May 31, 2019  (JP) .................................. 2019-102038

(51) Int. Cl.
*H01L 27/12*   (2006.01)
*H03B 5/12*    (2006.01)
*H04B 1/40*    (2015.01)

(52) U.S. Cl.
CPC ...... *H01L 27/1207* (2013.01); *H01L 27/1225* (2013.01); *H03B 5/12* (2013.01); *H01L 27/124* (2013.01); *H04B 1/40* (2013.01)

(58) Field of Classification Search
CPC ............. H01L 27/1207; H01L 27/1225; H01L 27/124; H01L 21/822; H01L 21/8234;
(Continued)

(56) References Cited

U.S. PATENT DOCUMENTS 4,553,098 A    11/1985  Yoh et al.
5,384,740 A    1/1995   Etoh et al.
(Continued)

FOREIGN PATENT DOCUMENTS

CN    104160627 A    11/2014
CN    105009299 A    10/2015
(Continued)

OTHER PUBLICATIONS

International Search Report (Application No. PCT/IB2020/054665) dated Aug. 25, 2020.
(Continued)

*Primary Examiner* — Richard Tan
(74) *Attorney, Agent, or Firm* — NIXON PEABODY LLP; Jeffrey L. Costellia

(57) ABSTRACT

A semiconductor device with a novel structure is provided. The semiconductor device includes an oscillation circuit including a first coil, a second coil, a first capacitor, a second capacitor, a first transistor, and a second transistor and a frequency correction circuit including a third capacitor, a fourth capacitor, a third transistor, a fourth transistor, and a switching circuit. The switching circuit has a function of controlling a conduction state or a non-conduction state of the third transistor and the fourth transistor. The frequency correction circuit is provided above the oscillation circuit
(Continued)

and has a function of adjusting an oscillation frequency of the oscillation circuit. The first transistor and the second transistor each include a semiconductor layer containing silicon in a channel formation region. The third transistor and the fourth transistor each include a semiconductor layer containing an oxide semiconductor in a channel formation region.

7 Claims, 25 Drawing Sheets

(58) Field of Classification Search
CPC ....... H01L 27/04; H01L 27/06; H01L 27/088; H03B 5/12; H03B 5/1228; H03B 5/1212; H04B 1/40
USPC ...................................................... 331/117 R
See application file for complete search history.

(56) References Cited

U.S. PATENT DOCUMENTS

| | | | |
|---|---|---|---|
| 7,061,014 B2 | 6/2006 | Hosono et al. |
| 7,282,782 B2 | 10/2007 | Hoffman et al. |
| 7,297,977 B2 | 11/2007 | Hoffman et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,468,304 B2 | 12/2008 | Kaji et al. |
| 7,847,622 B2 | 12/2010 | Kawasaki |
| 8,134,355 B2 | 3/2012 | Inoue et al. |
| 8,344,788 B2 | 1/2013 | Yamazaki et al. |
| 8,582,349 B2 | 11/2013 | Yamazaki et al. |
| 9,236,872 B2 | 1/2016 | Tsuhara et al. |
| 9,705,001 B2 | 7/2017 | Yamazaki |
| 9,742,356 B2 | 8/2017 | Takahashi et al. |
| 10,164,614 B2 | 12/2018 | Yang et al. |
| 10,256,347 B2 | 4/2019 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2004/0127038 A1 | 7/2004 | Carcia et al. |
| 2005/0274982 A1 | 12/2005 | Ueda et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0197092 A1 | 9/2006 | Hoffman et al. |
| 2006/0228974 A1 | 10/2006 | Thelss et al. |
| 2006/0231882 A1 | 10/2006 | Kim et al. |
| 2006/0284171 A1 | 12/2006 | Levy et al. |
| 2006/0284172 A1 | 12/2006 | Ishii |
| 2007/0046191 A1 | 3/2007 | Saito |
| 2007/0052025 A1 | 3/2007 | Yabuta |
| 2007/0090365 A1 | 4/2007 | Hayashi et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0129195 A1 | 6/2008 | Ishizaki et al. |
| 2008/0182358 A1 | 7/2008 | Cowdery-Corvan et al. |
| 2008/0224133 A1 | 9/2008 | Park et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0114910 A1 | 5/2009 | Chang |
| 2009/0152506 A1 | 6/2009 | Umeda et al. |
| 2009/0289732 A1 | 11/2009 | Miyashita |
| 2010/0065844 A1 | 3/2010 | Tokunaga |
| 2010/0109002 A1 | 5/2010 | Itagaki et al. |
| 2012/0049889 A1 | 3/2012 | Hatano |
| 2012/0140523 A1 | 6/2012 | Takahashi et al. |
| 2014/0191810 A1* | 7/2014 | Hwang ................. H03L 7/10 331/16 |
| 2014/0264324 A1 | 9/2014 | Yamazaki |
| 2015/0077193 A1 | 3/2015 | Tsuhara et al. |
| 2017/0288650 A1 | 10/2017 | Yang et al. |

FOREIGN PATENT DOCUMENTS

| | | |
|---|---|---|
| CN | 107276535 A | 10/2017 |
| DE | 102017106095 | 10/2017 |
| JP | 01-259628 A | 10/1989 |
| JP | 2009-284329 A | 12/2009 |
| JP | 2014-199924 A | 10/2014 |
| JP | 2017-188884 A | 10/2017 |
| JP | 2018-186313 A | 11/2018 |
| JP | 2020-031245 A | 2/2020 |
| KR | 2015-0129825 A | 11/2015 |
| WO | WO-2013/136766 | 9/2013 |
| WO | WO-2014/142333 | 9/2014 |
| WO | WO-2017/026590 | 2/2017 |

OTHER PUBLICATIONS

Written Opinion (Application No. PCT/IB2020/054665) dated Aug. 25, 2020.

Figueiredo.P et al., "A 90nm CMOS 1.2V 6b 1GS/s Two-Step Subranging ADC", ISSCC 2006 (Digest of Technical Papers. IEEE International Solid-State Circuits Conference), Feb. 6, 2006, pp. 568-569.

Qin.W et al., "An 800mW Fully Integrated Galvanic Isolated Power Transfer System Meeting CISPR 22 Class-B Emission Levels with 6dB Margin", ISSCC 2019 (Digest of Technical Papers. IEEE International Solid-State Circuits Conference), Feb. 17, 2019, pp. 246-247.

* cited by examiner

FIG. 19A
| Amorphous | Intermediate state<br>New crystalline phase<br>Crystalline | Crystal |
|---|---|---|
| •completely amorphous | •CAAC<br>•nc<br>•CAC | •single crystal<br>•poly crystal |
FIG. 19B
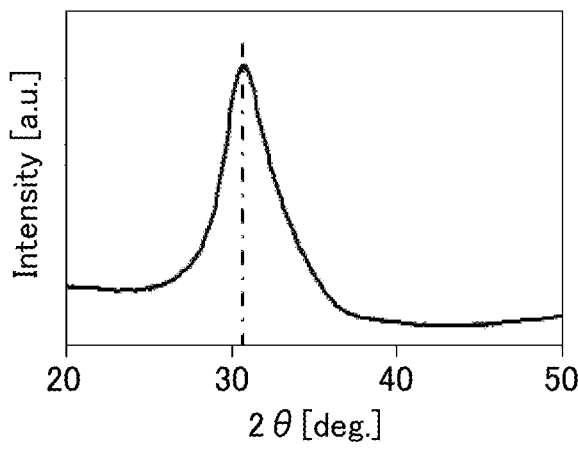
FIG. 19C
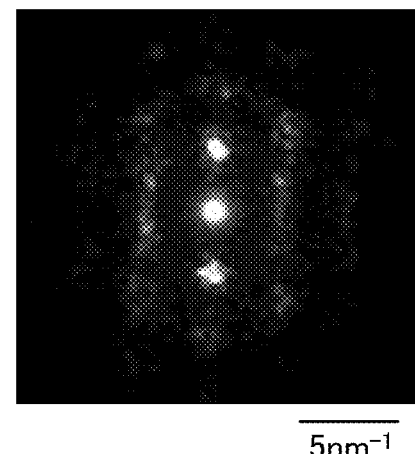

SEMICONDUCTOR DEVICE AND WIRELESS COMMUNICATION DEVICE WITH THE SEMICONDUCTOR DEVICE

TECHNICAL FIELD

One embodiment of the present invention relates to a semiconductor device.

In this specification and the like, a semiconductor device generally means a device that can function by utilizing semiconductor characteristics. It can be sometimes said that a display device (a liquid crystal display device, a light-emitting display device, and the like), a projection device, a lighting device, an electro-optical device, a power storage device, a memory device, a semiconductor circuit, an imaging device, a sensor device, and the like include a semiconductor device.

BACKGROUND ART

With the development of information technology such as IoT (Internet of Things), the amount of communicated data has been increasing. In order to deal with the increase in the amount of data, a new communication standard called the fifth-generation mobile communication system (5G) that achieves higher transmission speed, more simultaneous connections, and shorter delay time than the fourth-generation mobile communication system (4G) has been examined (for example, see Patent Document 1). In Japan, 5G uses communication frequencies of a 3.7 GHz band, a 4.5 GHz band, and a 28 GHz band.

Meanwhile, mobile communication or the like requires power saving and downsizing of a semiconductor integrated circuit (IC) in addition to an improvement in performance such as an increase in communication speed. Thus, power saving and downsizing of a circuit are extremely important for an electronic device based on a communication standard of 5G. However, in general, power saving and downsizing of a circuit have a trade-off relationship with an improvement in performance.

REFERENCE

Patent Document

[Patent Document 1] PCT International Publication No. 2017/026590

SUMMARY OF THE INVENTION

Problems to be Solved by the Invention

An object of one embodiment of the present invention is to provide a semiconductor device with a novel structure that can inhibit an increase in circuit area. Another object is to provide a semiconductor device with a novel structure that can inhibit an increase in power consumption. Another object of one embodiment of the present invention is to provide a novel semiconductor device and the like.

Note that the description of these objects does not preclude the existence of other objects. One embodiment of the present invention does not have to achieve all these objects. Other objects will be apparent from the description of the specification, the drawings, the claims, and the like, and other objects can be derived from the description of the specification, the drawings, the claims, and the like.

Means for Solving the Problems

One embodiment of the present invention is a semiconductor device including an oscillation circuit that includes a first coil, a second coil, a first capacitor, a second capacitor, a first transistor, and a second transistor and a frequency correction circuit that includes a third capacitor, a fourth capacitor, a third transistor, a fourth transistor, and a switching circuit; the switching circuit has a function of controlling a conduction state or a non-conduction state of the third transistor and the fourth transistor; the frequency correction circuit is provided above the oscillation circuit and has a function of adjusting an oscillation frequency of the oscillation circuit; the first transistor and the second transistor each include a semiconductor layer containing silicon in a channel formation region; and the third transistor and the fourth transistor each include a semiconductor layer containing an oxide semiconductor in a channel formation region.

In the semiconductor device of one embodiment of the present invention, it is preferable that the switching circuit include a fifth transistor to an eighth transistor and the fifth transistor to the eighth transistor each include a semiconductor layer containing an oxide semiconductor in a channel formation region.

In the semiconductor device of one embodiment of the present invention, it is preferable that the fifth transistor have a function of controlling a conduction state or a non-conduction state between a gate of the third transistor and the third capacitor, the sixth transistor have a function of controlling a conduction state or a non-conduction state between a gate of the fourth transistor and the fourth capacitor, the seventh transistor have a function of controlling a conduction state or a non-conduction state between the gate of the third transistor and a wiring supplying a low power supply potential, and the eighth transistor have a function of controlling a conduction state or a non-conduction state between the gate of the fourth transistor and the wiring supplying a low power supply potential.

One embodiment of the present invention is a wireless communication device including an integrated circuit that includes an antenna, a mixer, an oscillator, and an analog-digital converter circuit; the oscillator includes an oscillation circuit including a first coil, a second coil, a first capacitor, a second capacitor, a first transistor, and a second transistor and a frequency correction circuit including a third capacitor, a fourth capacitor, a third transistor, a fourth transistor, and a switching circuit; the switching circuit has a function of controlling a conduction state or a non-conduction state of the third transistor and the fourth transistor; the frequency correction circuit is provided above the oscillation circuit and has a function of adjusting an oscillation frequency of the oscillation circuit; the first transistor and the second transistor each include a semiconductor layer containing silicon in a channel formation region; and the third transistor and the fourth transistor each include a semiconductor layer containing an oxide semiconductor in a channel formation region.

In the wireless communication device of one embodiment of the present invention, it is preferable that the switching circuit include a fifth transistor to an eighth transistor and the fifth transistor to the eighth transistor each include a semiconductor layer containing an oxide semiconductor in a channel formation region.

In the wireless communication device of one embodiment of the present invention, it is preferable that the fifth transistor have a function of controlling a conduction state or a non-conduction state between a gate of the third transistor and the third capacitor, the sixth transistor have a function of controlling a conduction state or a non-conduction state between a gate of the fourth transistor and the fourth capacitor, the seventh transistor have a function of controlling a conduction state or a non-conduction state between the gate of the third transistor and a wiring supplying a low power supply potential, and the eighth transistor have a function of controlling a conduction state or a non-conduction state between the gate of the fourth transistor and the wiring supplying a low power supply potential.

In the wireless communication device of one embodiment of the present invention, it is preferable that the analog-digital converter circuit include a comparison circuit, the comparison circuit include a differential amplifier circuit and an offset correction circuit, the differential circuit include an output terminal and an inverted output terminal, the offset correction circuit include a constant current circuit and a ninth transistor to a twelfth transistor, one of a source and a drain of the ninth transistor be electrically connected to the output terminal, one of a source and a drain of the tenth transistor be electrically connected to the inverted output terminal, one of a source and a drain of the eleventh transistor be electrically connected to a gate of the ninth transistor, one of a source and a drain of the twelfth transistor be electrically connected to a gate of the tenth transistor, and the eleventh transistor and the twelfth transistor each include a semiconductor layer containing an oxide semiconductor in a channel formation region.

Effect of the Invention

According to one embodiment of the present invention, a semiconductor device with a novel structure that can inhibit an increase in circuit area can be provided. A semiconductor device with a novel structure that can inhibit an increase in power consumption can also be provided. According to another embodiment of the present invention, a novel semiconductor device and the like can be provided.

Note that the description of these effects does not preclude the existence of other effects. One embodiment of the present invention does not have to have all these effects. Other effects will be apparent from the description of the specification, the drawings, the claims, and the like, and other effects can be derived from the description of the specification, the drawings, the claims, and the like.

BRIEF DESCRIPTION OF THE DRAWINGS

FIG. 19A is a diagram showing classifications of crystal structures of IGZO. FIG. 19B is a graph showing an XRD spectrum of a CAAC-IGZO film. FIG. 19C is an image showing nanobeam electron diffraction patterns of a CAAC-IGZO film.

MODE FOR CARRYING OUT THE INVENTION

Figure 1A:
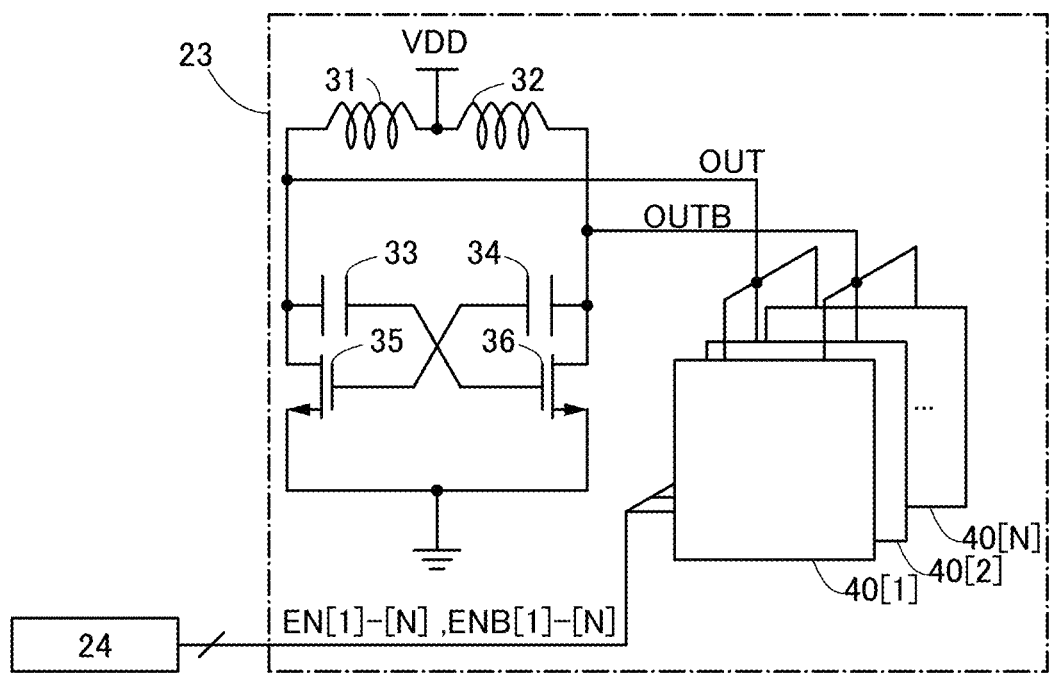
FIG. 1A and FIG. 1B are circuit diagrams each illustrating a structure of a semiconductor device.

Embodiments of the present invention will be described below. Note that one embodiment of the present invention is not limited to the following description, and it will be readily appreciated by those skilled in the art that modes and details of the present invention can be modified in various ways without departing from the spirit and scope of the present invention. One embodiment of the present invention therefore should not be construed as being limited to the following description of the embodiments.

Note that ordinal numbers such as "first", "second", and "third" in this specification and the like are used in order to avoid confusion among components. Thus, the ordinal numbers do not limit the number of components. In addition, the ordinal numbers do not limit the order of components. In this specification and the like, for example, a "first" component in one embodiment can be referred to as a "second" component in other embodiments or claims. Furthermore, in this specification and the like, for example, a "first" component in one embodiment can be omitted in other embodiments or claims.

The same components, components having similar functions, components made of the same material, components formed at the same time, and the like in the drawings are denoted by the same reference numerals, and repetitive description thereof is skipped in some cases.

In this specification, a power supply potential VDD may be abbreviated to a potential VDD, VDD, or the like, for example. The same applies to other components (e.g., a signal, a voltage, a circuit, an element, an electrode, and a wiring).

In the case where a plurality of components are denoted by the same reference numerals, and, particularly when they need to be distinguished from each other, an identification sign such as "_1", "_2", "[n]", or "[m,n]" is sometimes added to the reference numerals. For example, the second wiring GL is referred to as a wiring GL[2].

Embodiment 1

A structure and operation of a semiconductor device of one embodiment of the present invention will be described with reference to FIG. 1 to FIG. 5. The semiconductor device of one embodiment of the present invention functions as an oscillator for oscillating a signal with a frequency corresponding to that of a digital signal, what is called a digital controlled oscillator (DCO). A signal with a predetermined frequency can be used as a signal output from a local oscillator (LO) such as a wireless communication device.

FIG. 1A is a circuit diagram illustrating a structure of a semiconductor device functioning as an oscillator that can be used as a wireless communication device.

A semiconductor device 23 includes coils 31 and 32, capacitors 33 and 34, and transistors 35 and 36. The semiconductor device 23 includes N (N is a natural number) frequency correction circuits 40[1] to 40[N] each of which is connected to terminals OUT and OUTB. The frequency correction circuits 40[1] to 40[N] are controlled with control signals EN[1] to EN[N] and control signals ENB[1] to ENB[N]. The control signals EN[1] to EN[N] and the control signals ENB [1] to ENB[N] are signals output from a control circuit 24. The control signals ENB[1] to ENB[N] are inverted signals of the control signals EN[1] to EN[N] and are sometimes referred to as inverted control signals.

The coils 31 and 32, the capacitors 33 and 34, and the transistors 35 and 36 function as an oscillation circuit that can oscillate a signal with a frequency $f_{OSC}$. When an oscillation frequency is $f_{OSC}$, the oscillation frequency $f_{OSC}$ can be expressed by Formula (1). In Formula (1), L is a reactance component of the coils 31 and 32. In addition, $C_0$ is a capacitance component of the capacitors 33 and 34.

[Formula 1]

$$f_{OSC} = \frac{1}{2\pi\sqrt{LC_0}} \quad (1)$$

The frequency correction circuits 40[1] to 40[N] can adjust the oscillation frequency by increasing or decreasing the capacitance component of the semiconductor device 23. The control signals EN[1] to EN[N] and the control signals ENB[1] to ENB[N] are signals for controlling whether to make the capacitance components of the frequency correction circuits 40[1] to 40[N] function in the semiconductor device 23. When one of the capacitance components $C_1$ of the frequency correction circuits 40[1] to 40[N] is enabled, the oscillation frequency $f_{OSC}$ can be expressed by Formula (2).

[Formula 2]

$$f_{OSC} = \frac{1}{2\pi\sqrt{L(C_0 + C_1)}} \quad (2)$$

Similarly, when control is performed such that two of the capacitance components $C_1$ of the frequency correction circuits 40[1] to 40[N] are enabled, the oscillation frequency $f_{OSC}$ can be expressed by Formula (3). That is, the number of enabled capacitance components $C_1$ of the N frequency correction circuits 40[1] to 40[N] is adjusted, so that the oscillation frequency $f_{OSC}$ can be expressed by Formula (4).

[Formula 3]

$$f_{OSC} = \frac{1}{2\pi\sqrt{L(C_0 + 2C_1)}} \quad (3)$$

[Formula 4]

$$f_{OSC} = \frac{1}{2\pi\sqrt{L(C_0 + N \times C_1)}} \quad (4)$$

Power supply voltage based on a voltage VDD and a ground potential is applied to the semiconductor device 23. The voltage VDD is illustrated to be applied to a node between the coil 31 and the coil 32; in the case where the coil 31 and the coil 32 are provided as one coil, the voltage VDD is applied to the one coil.

The transistors 35 and 36 are each a transistor including a semiconductor layer that contains silicon in a channel formation region (hereinafter, a Si transistor). FIG. 1A illustrates n-channel transistors as the transistors 35 and 36, for example. The Si transistor can be fabricated by a CMOS (Complementary Metal Oxide Semiconductor) technology.

In the semiconductor device 23, increasing the number of frequency correction circuits 40[1] to 40[N] facilitates adjustment of the oscillation frequency $f_{OSC}$, which enables performance to be improved. On the other hand, increasing the number of frequency correction circuits 40[1] to 40[N] increases the circuit area. In addition, extension of wirings, which are the terminals OUT and OUTB, increases parasitic capacitance or parasitic resistance. Owing to an increase in parasitic capacitance or parasitic resistance, a desired oscillation frequency cannot be obtained and power consumption may increase.

Figure 1B:
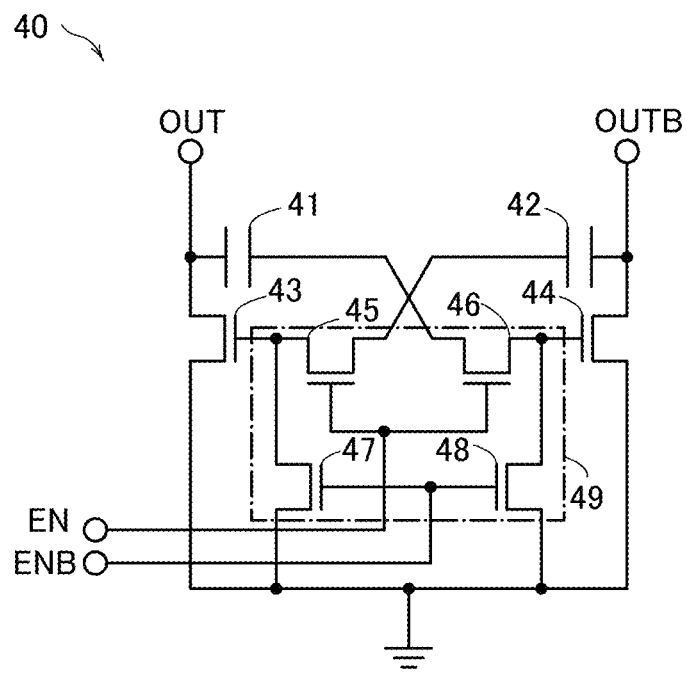

FIG. 1B is a circuit diagram illustrating a circuit structure of the frequency correction circuit 40 that can be used as the frequency correction circuits 40[1] to 40[N] in the semiconductor device 23 illustrated in FIG. 1A.

The frequency correction circuit 40 includes capacitors 41 and 42 and transistors 43 to 48. The transistors 43 and 44 function as amplifiers in the frequency correction circuit 40. The transistors 45 to 48 function as switches in the frequency correction circuit 40. The control signal EN and the control signal ENB that can be used as the control signals EN[1] to EN[N] and the control signals ENB[1] to ENB[N] are signals for performing control such that a pair of transistors 45 and 46 and a pair of transistors 47 and 48 are alternately turned on or off.

As the transistors 43 to 48 in FIG. 1B, a transistor including an oxide semiconductor in a channel formation region (hereinafter, referred to as an OS transistor) is used. In the structure of one embodiment of the present invention, the use of the OS transistor as the transistors 43 to 48 enables leakage current flowing between their sources and drains when the transistors are off (hereinafter, off-state current) to be extremely low and power consumption to be reduced.

The frequency correction circuit 40 using the OS transistor can be freely placed above a circuit using the Si transistor. Thus, even when the semiconductor device 23 includes a plurality of frequency correction circuits 40, the frequency correction circuits 40 are stacked above the circuit formed using the Si transistor, so that integration can be easily achieved. Furthermore, the OS transistor can be fabricated with a manufacturing apparatus similar to that for the Si transistor and thus can be fabricated at low cost.

An OS transistor can be a four-terminal semiconductor element including a back gate electrode in addition to a gate electrode, a source electrode, and a drain electrode. The OS transistor can be formed with an electric circuit network that can independently control input and output of signals flowing between a source and a drain depending on a voltage applied to the gate electrode or the back gate electrode. Thus, the circuit design can be made on the same concept as that for LSI. Furthermore, electrical characteristics of the OS transistor are better than those of a Si transistor in a high-temperature environment. Specifically, the ratio between an on-state current and an off-state current is large even at a high temperature higher than or equal to 125° C. and lower than or equal to 150° C.; thus, favorable switching operation can be performed.

In the frequency correction circuit 40, the transistors 45 to 48 form a circuit having a function of switching the conduction state and the non-conduction state (on and off) of the transistors 43 and 44. The transistors 45 to 48 are sometimes referred to as a switching circuit 49.

The transistor 45 has a function of controlling the conduction state or the non-conduction state between a gate of the transistor 43 and the capacitor 42. The transistor 46 has a function of controlling the conduction state or the non-conduction state between a gate of the transistor 44 and the capacitor 41. The transistor 47 has a function of controlling the conduction state or the non-conduction state between the gate of the transistor 43 and a wiring for supplying a low power supply potential (denoted as a grounded wiring in the diagram). The transistor 48 has a function of controlling the conduction state or the non-conduction state between the gate of the transistor 44 and the wiring for supplying a low power supply potential.

Figure 2A:
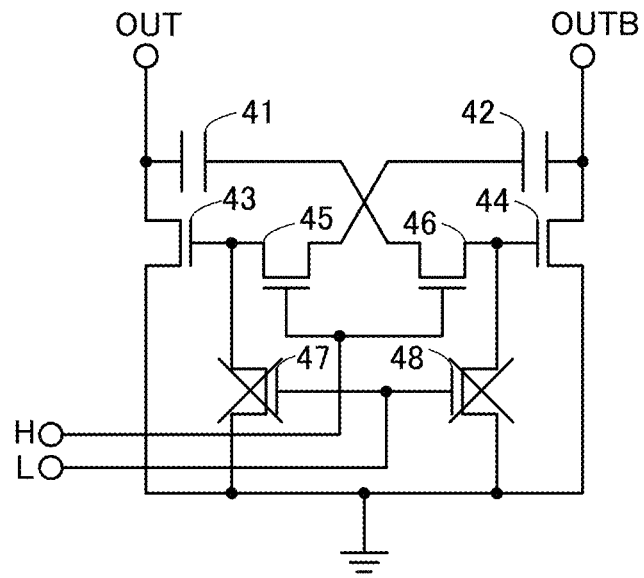
FIG. 2A and FIG. 2B are circuit diagrams illustrating a structure of a semiconductor device.
Figure 2B:
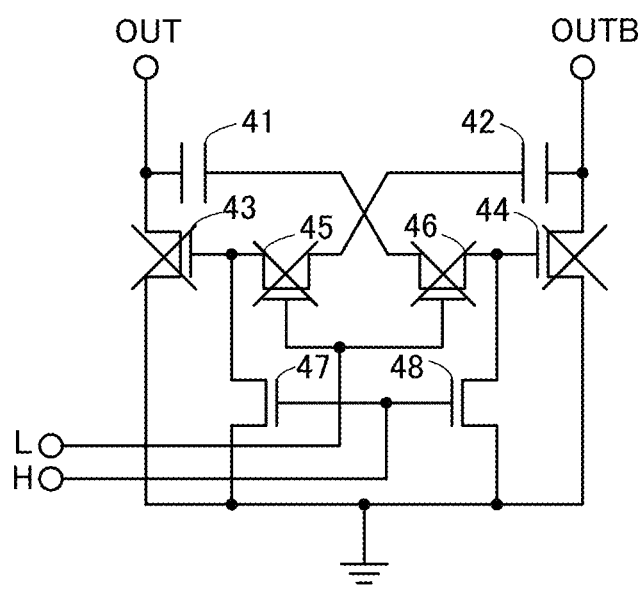

FIG. 2A and FIG. 2B are diagrams illustrating operation of the switching circuit 49. For simple description of diagrams illustrating operation in circuit diagrams in this specification and the like, transistors in an off state are marked with a cross.

FIG. 2A is a diagram illustrating operation at the time when the control signal EN is set at an H level and the control signal ENB is set at an L level. As illustrated in FIG. 2A, the transistors 45 and 46 are turned on and the transistors 47 and 48 are turned off. Thus, on/off of the transistors 43 and 44 can be switched. That is, the capacitance component $C_1$ of the capacitors 41 and 42 can contribute to the oscillation frequency $F_{OSC}$.

FIG. 2B is a diagram illustrating operation at the time when the control signal EN is set at an L level and the control signal ENB is set at an H level. As illustrated in FIG. 2B, the transistors 45 and 46 are turned off and the transistors 47 and 48 are turned on. Thus, the transistors 43 and 44 can be turned off. That is, the capacitance component $C_1$ of the capacitors 41 and 42 does not contribute to the oscillation frequency $F_{OSC}$.

Figure 3A:
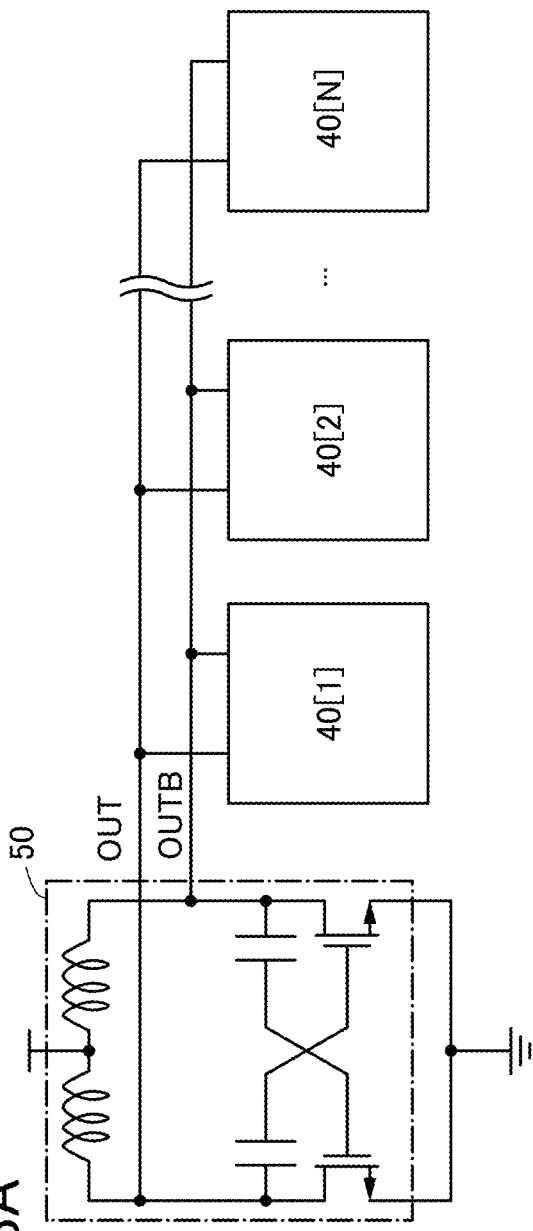
FIG. 3A and FIG. 3B are a circuit diagram and a schematic diagram illustrating a structure of a semiconductor device.

FIG. 3A illustrates an oscillation circuit 50 including the coils 31 and 32, the capacitors 33 and 34, and the transistors 35 and 36, which are described with reference to FIG. 1A, and the frequency correction circuits 40[1] to 40[N] connected to the wirings to be the terminals OUT and OUTB. As illustrated in FIG. 3A, the frequency correction circuits 40[1] to 40[N] are connected in parallel to the wirings to be the terminals OUT and OUTB.

Figure 3B:
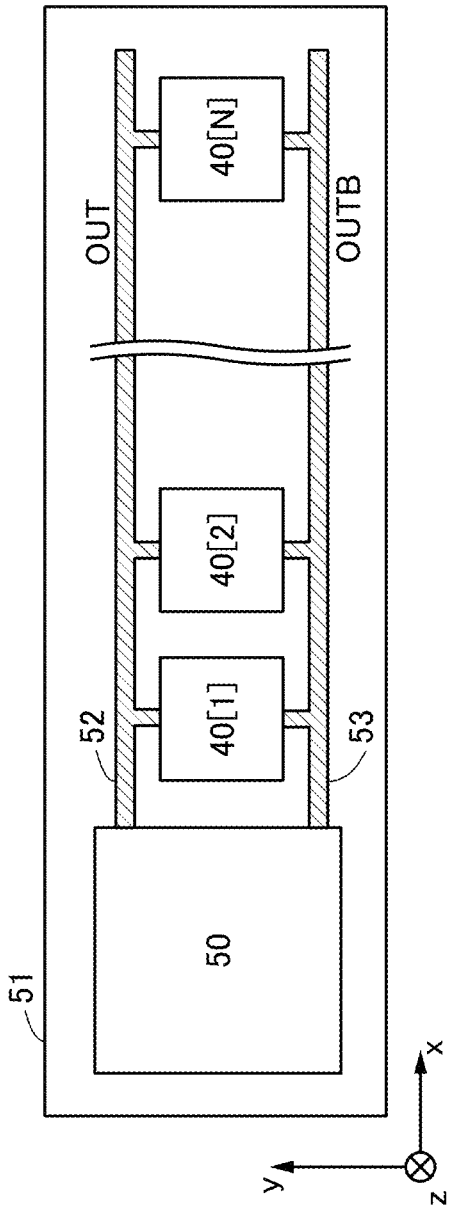

FIG. 3B is a schematic diagram of the case where the wirings and circuits illustrated in FIG. 3A are placed over a substrate. In FIG. 3B, a plane where the wirings and the circuits are placed is an x-y plane, and the z-axis direction is perpendicular to the plane.

As illustrated in FIG. 3B, in the x-y plane, the oscillation circuit 50 is placed over a substrate 51 and the frequency correction circuits 40[1] to 40[N] are connected in parallel to wirings 52 and 53 extending in the x direction. That is, in the structure in FIG. 3B, as the number of frequency correction circuits 40[1] to 40[N] increases, the wirings 52 and 53 extend more in the x direction.

The wirings 52 and 53 and the circuits each generate parasitic resistance and parasitic capacitance in the x-y plane. The parasitic resistance and the parasitic capacitance lead to variation in the oscillation frequency. In order to reduce the size and power consumption of a semiconductor device, spaces between wirings, between elements, and between a wiring and an element, for example, are desirably reduced; however, the reduction of the spaces increases parasitic resistance and parasitic capacitance and thus performance becomes poor; for example, a desired frequency cannot be obtained. Thus, the structure in FIG. 3B causes a problem in improving performance.

Figure 4:
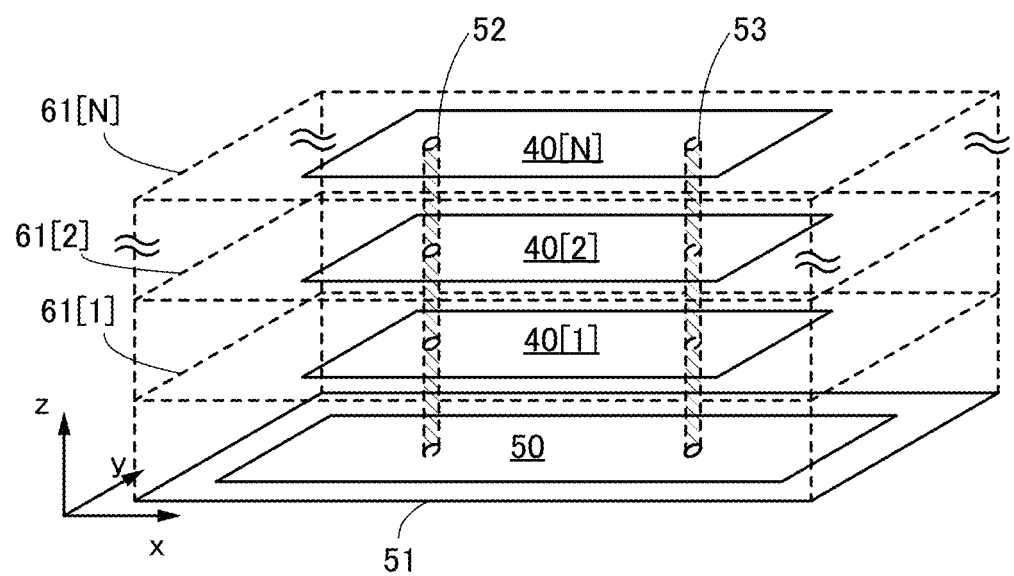
FIG. 4 is a schematic diagram illustrating a structure of a semiconductor device.

FIG. 4 is a schematic diagram of a circuit layout in the case where the transistors 43 to 48, which are the OS transistors and described with reference to FIG. 1B, are used in the structure illustrated in FIG. 3A. FIG. 4 illustrates the x-y plane and the z-axis perpendicular to the x-y plane. FIG. 4 is different from FIG. 3B in that a perspective view is illustrated for easy understanding of layers provided in the z-axis direction.

As illustrated in FIG. 4, layers 61[1] and 61[2] to 61[N] including the OS transistors are stacked in the z-axis direction over the oscillation circuit 50 provided over the substrate 51. In the layers 61[1] and 61[2] to 61[N] including the OS transistors, the frequency correction circuits 40[1] to 40[N] and the wirings 52 and 53 for connecting the frequency correction circuits 40[1] to 40[N] to the oscillation circuit 50 can be placed in the z direction.

The wirings 52 and 53 and the circuits are provided in the z-axis direction. Thus, in the layers, the circuits and the wirings can be placed with spaces therebetween. The wirings and the circuits can be placed with the spaces therebetween without an increase in the area of the substrate 51. In the structure in FIG. 3B, as the number of frequency correction circuits increases, the area of a portion where the wirings overlap with the circuits increases. By contrast, in the structure in FIG. 4, even when the number of frequency correction circuits increases, the area of a portion where the wirings overlap with the circuits can be small. The layers 61[1] to 61[N] in which the frequency correction circuits 40[1] to 40[N] are provided can be apart from the substrate 51, which can significantly reduce parasitic capacitance. Thus, even the increased number of frequency correction circuits 40[1] to 40[N] does not result in an increase in the circuit scale while an increase in parasitic resistance and parasitic capacitance is kept small. Accordingly, in addition to a reduction in size and power consumption of a semiconductor device, an improvement in performance, such as adjustment of a frequency to the desired one, can be achieved when the number of frequency correction circuits 40[1] to 40[N] is increased.

Figure 5A:
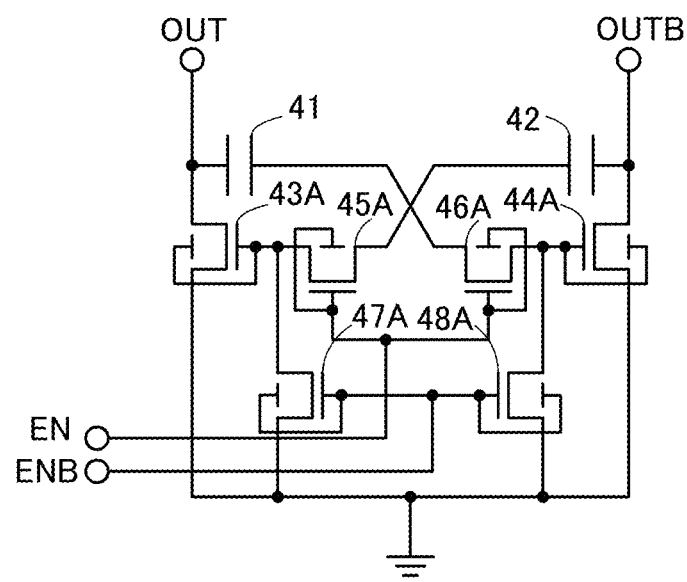
FIG. 5A and FIG. 5B are circuit diagrams illustrating a structure of a semiconductor device.
Figure 5B:
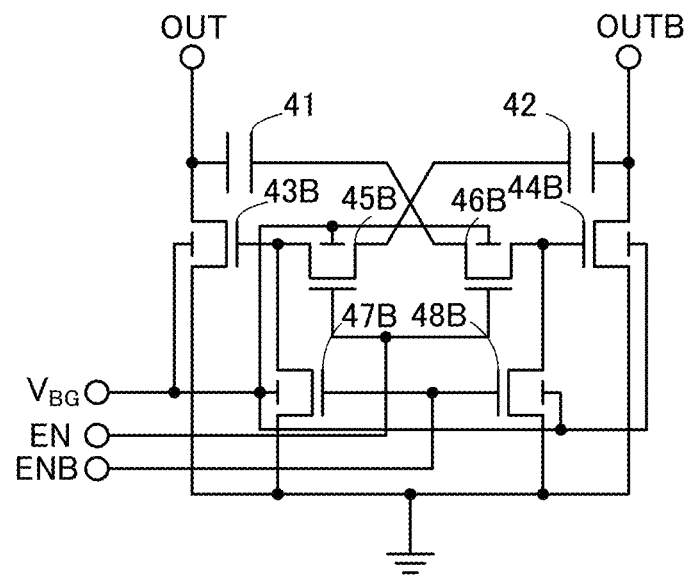

FIG. 5A and FIG. 5B are circuit diagrams illustrating modification examples of the frequency correction circuit 40 illustrated in FIG. 1B.

In FIG. 1B, each transistor is illustrated as a transistor having a top-gate structure or a bottom-gate structure without a back gate electrode; however, the structures of the transistors are not limited thereto. For example, as illustrated in FIG. 5A, transistors 43A to 48A each including a back gate electrode connected to a gate electrode may be used. With the structure of FIG. 5A, the amount of current flowing through the transistors can be increased.

Alternatively, as illustrated in FIG. 5B, transistors 43B to 48B each including a back gate electrode connected to a terminal that applies a back gate voltage $V_{BG}$ may be used. With the structure of FIG. 5B, electrical characteristics such as the threshold voltages of the transistors can be easily controlled from the outside.

The semiconductor device of one embodiment of the present invention described above can be a semiconductor device in which an increase in the circuit area is inhibited and an improvement in performance such as adjustment of an oscillation frequency is achieved.

Embodiment 2

In this embodiment, a structure example of a wireless communication device including an integrated circuit including the semiconductor device 23 described in the above embodiment is described with reference to FIG. 6 and FIG. 7. Although a smartphone is described as an example of the wireless communication device in this embodiment, other wireless communication terminals such as a portable game terminal, a tablet PC (Personal Computer), and a laptop PC may be used. The wireless communication device of this embodiment can be used as a device that can perform wireless communication.

Figure 6:
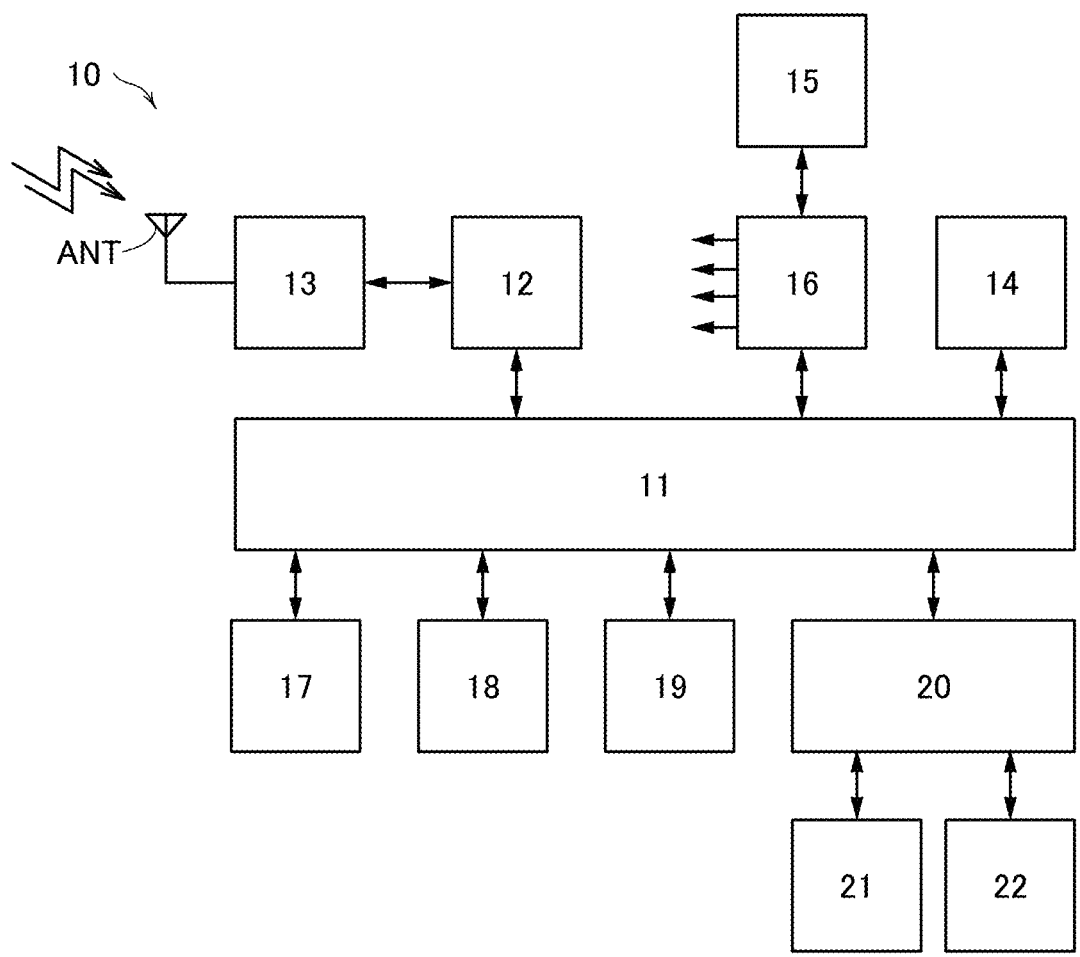
FIG. 6 is a block diagram illustrating a structure of a wireless communication device.

A wireless communication device 10 illustrated in a block diagram in FIG. 6 includes an antenna ANT, an application processor 11, a baseband processor 12, an integrated circuit 13 (IC), a memory 14, a battery 15, a power management IC (PMIC) 16, a display portion 17, a camera portion 18, an operation input portion 19, an audio IC 20, a microphone 21, and a speaker 22. Note that the integrated circuit 13 is also referred to as an RF (Radio Frequency) IC or a wireless chip, for example.

A plurality of antennas ANT for a plurality of frequency bands are provided to be compatible with a communication standard of 5G.

The application processor 11 has a function of performing processing for fulfilling various functions of the wireless communication device 10 by reading out a program stored in the memory 14. For example, the application processor 11 has a function of executing an OS (Operating System) program from the memory 14 and executing an application program with this OS program as an operating platform.

The baseband processor 12 has a function of performing baseband processing including encoding (e.g., error correction encoding) processing, decoding processing, or the like on data that is transmitted and received by the wireless communication device 10. Specifically, the baseband processor 12 has a function of receiving transmission data from the application processor 11, performing encoding processing on the received transmission data, and transmitting the data to the integrated circuit 13. In addition, the baseband processor 12 has a function of receiving reception data from the integrated circuit 13, performing decoding processing on the received reception data, and transmitting the data to the application processor 11.

The integrated circuit 13 has a function of performing modulation processing or demodulation processing on data that is transmitted and received by the wireless communication device 10. Specifically, the integrated circuit 13 has a function of generating a transmission signal by performing modulation processing using a carrier wave on the transmission data received from the baseband processor 12 and outputting the transmission signal via the antenna ANT. In addition, the integrated circuit 13 has a function of receiving a reception signal via the antenna ANT, generating reception data by performing demodulation processing using a carrier wave on the reception signal, and transmitting the reception data to the baseband processor 12.

The memory 14 has a function of storing a program and data used by the application processor 11. Note that the memory 14 includes a nonvolatile memory that holds stored data even when power supply is interrupted and a volatile memory that loses stored data in the case where power supply is interrupted.

The battery 15 is used when the wireless communication device 10 operates without an external power supply device. Note that the wireless communication device 10 can use power supply from the battery 15 also in the case where an external power supply is connected. A secondary battery capable of charging and discharging is preferably used as the battery 15.

The power management IC 16 has a function of generating internal power supply voltage from the battery 15 or the external power supply. The internal power supply voltage is applied to each of the blocks in the wireless communication device 10. At this time, the power management IC 16 has a function of controlling the internal power supply voltage for each block to which the internal power supply voltage is supplied. The power management IC 16 controls the internal power supply voltage on the basis of an instruction from the application processor 11. In addition, the power management IC 16 can control supply and interrupt of supply of the internal power supply voltage block by block. The power management IC 16 also has a function of controlling charging to the battery 15 in the case where supply from the external power supply device is obtained.

The display portion 17 is a liquid crystal display device or a light-emitting display device and has a function of displaying various images in response to processing in the application processor 11. Images to be displayed on the display portion 17 include a user interface image with which a user gives an operation instruction to the wireless communication device 10, a camera image, a moving image, and the like.

The camera portion 18 has a function of acquiring an image in accordance with the instruction from the application processor 11. The operation input portion 19 has a function of a user interface that a user operates to give an operation instruction to the wireless communication device 10. The audio IC 20 has a function of driving the speaker 22 by decoding audio data transmitted from the application processor 11. In addition, the audio IC 20 has a function of generating audio data by encoding audio information obtained by the microphone 21 and outputting the audio data to the application processor 11.

Figure 7:
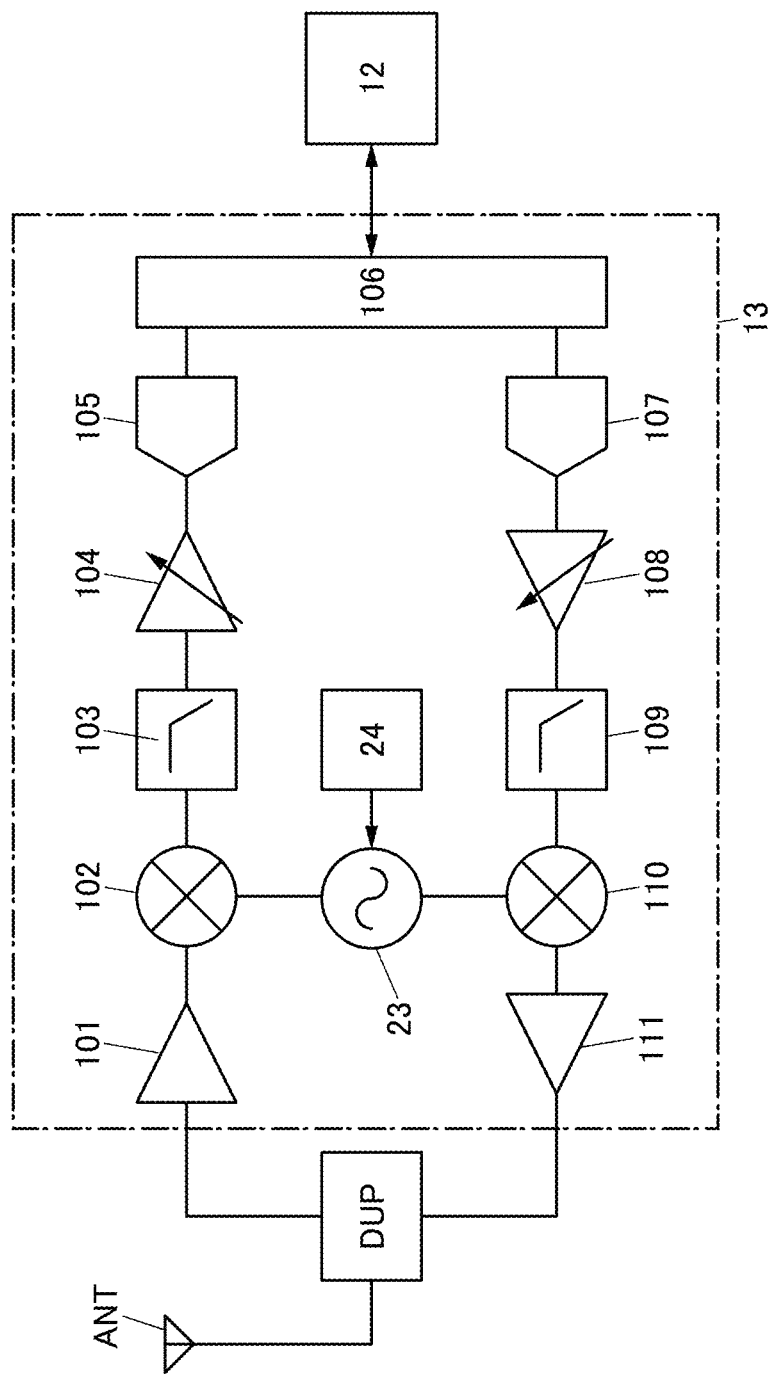
FIG. 7 is a block diagram illustrating a structure of a wireless communication device.

FIG. 7 is a block diagram illustrating a structure example of the integrated circuit 13. The integrated circuit 13 illustrated in FIG. 7 includes a low noise amplifier 101, a mixer 102, a low-pass filter 103, a variable gain amplifier 104, an analog-digital converter circuit 105, an interface portion 106, a digital-analog converter circuit 107, a variable gain amplifier 108, a low-pass filter 109, a mixer 110, a power amplifier 111, the semiconductor device 23 functioning as the oscillation circuit, and the control circuit 24. FIG. 7 also illustrates the antenna ANT, a duplexer DUP, and the baseband processor 12. Note that the low noise amplifier 101, the mixer 102, the low-pass filter 103, the variable gain amplifier 104, and the analog-digital converter circuit 105 are referred to as a receiving circuit block, and the digital-analog converter circuit 107, the variable gain amplifier 108, the low-pass filter 109, the mixer 110, and the power amplifier 111 are referred to as a transmitting circuit block in some cases.

Note that the baseband processor 12 and the integrated circuit 13 are formed of separate semiconductor chips. The duplexer DUP includes an antenna switch and the like.

The low noise amplifier 101 amplifies a signal received by the antenna ANT with low noise. The mixer 102 performs demodulation and downconversion (frequency conversion) using a signal of the semiconductor device 23 functioning as the oscillation circuit. The low-pass filter 103 removes an unnecessary high-frequency component from a signal from the mixer 102. The variable gain amplifier 104 amplifies an output signal from the low-pass filter 103 with a gain taking the input range of the analog-digital converter circuit 105 into account. The analog-digital converter circuit 105 converts the analog signal from the variable gain amplifier 104 into a digital signal. The digital signal is output to the baseband processor 12 via the interface portion 106.

The digital-analog converter circuit 107 converts the digital signal received by the interface portion 106 into an analog signal. The variable gain amplifier 108 amplifies an output signal from the digital-analog converter circuit 107. The low-pass filter 109 removes an unnecessary high-frequency component from a signal from the variable gain amplifier 108. The mixer 110 performs modulation and upconversion (frequency conversion) using a signal of the semiconductor device 23 functioning as the oscillation circuit. The power amplifier 111 amplifies an output signal from the mixer 110 with a predetermined gain and outputs the signal.

The composition, structure, method, and the like described in this embodiment can be used in combination as appropriate with the compositions, structures, methods, and the like described in the other embodiments, the example, and the like.

Embodiment 3

In this embodiment, structure examples of the analog-digital converter circuit 105 described in the above embodiment, in particular, structure examples of a comparison circuit included in the analog-digital converter circuit will be described with reference to FIG. 8A, FIG. 8B to FIG. 13A, and FIG. 13B.

Figure 8A:
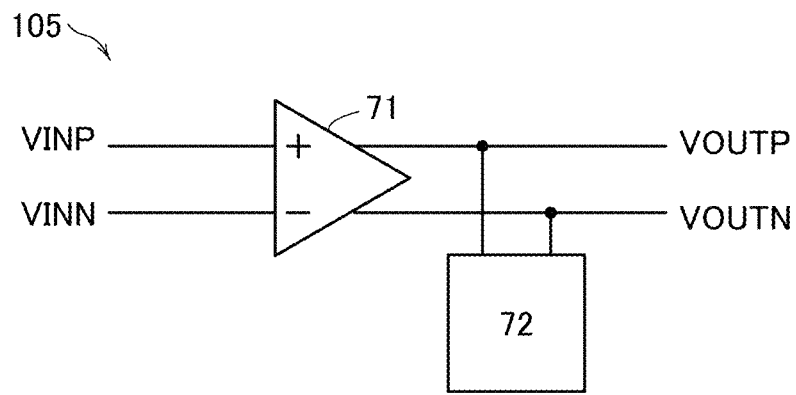
FIG. 8A and FIG. 8B are circuit diagrams illustrating a structure of an analog-digital converter circuit.

FIG. 8A is a diagram illustrating an example of a circuit structure of the comparison circuit included in the analog-digital converter circuit 105. FIG. 8A illustrates a differential amplifier circuit 71 and an offset correction circuit 72. FIG. 8A also illustrates input terminals VINP and VINN and output terminals VOUTP and VOUTN of the comparison circuit. The input terminal VINN is an inverted input terminal, and the output terminal VOUTN is an inverted output terminal.

The differential amplifier circuit 71 has a function of amplifying a difference between signals input to the input terminals VINP and VINN and outputting the amplified difference to the output terminals VOUTP and VOUTN. The offset correction circuit 72 is a circuit for correcting the offset voltage of the differential amplifier circuit 71.

Figure 8B:
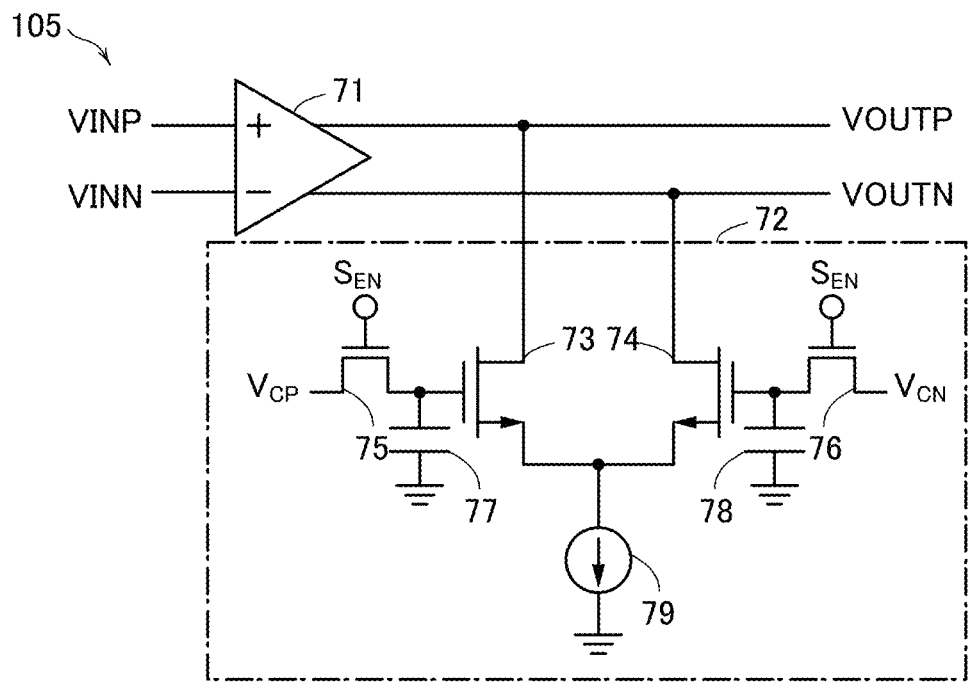

FIG. 8B is a diagram illustrating a circuit structure example of the offset correction circuit 72 illustrated in FIG. 8A. The offset correction circuit 72 includes a transistor 73, a transistor 74, a transistor 75, a transistor 76, a capacitor 77, a capacitor 78, and a constant current circuit 79. A signal $S_{EN}$ is a signal for controlling on/off of the transistors 75 and 76 functioning as switches. Voltages $V_{CN}$ and $V_{CP}$ are voltages for correcting offset. The transistors 73 and 74 are transistors for adjusting current flowing through the output terminals VOUTP and VOUTN in accordance with the voltages for correcting offset. The capacitor 77 is a capacitor for holding charge corresponding to the potential of a gate of the transistor 73. The capacitor 78 is a capacitor for holding charge corresponding to the potential of a gate of the transistor 74.

One of a source and a drain of the transistor 73 is connected to the output terminal VOUTP. One of a source and a drain of the transistor 74 is connected to the inverted output terminal VOUTN. One of a source and a drain of the transistor 75 is connected to the gate of the transistor 73. One of a source and a drain of the transistor 76 is connected to the gate of the transistor 74.

In FIG. 8B, the transistors 73 and 74 are n-channel Si transistors. Si transistors can be fabricated by a CMOS technology.

The transistors 75 and 76 are OS transistors. In the structure of one embodiment of the present invention, the use of OS transistors enables the capacitor 77 and the capacitor 78 to hold the voltages $V_{CN}$ and $V_{CP}$ in accordance with control of the signal $S_{EN}$, owing to extremely low leakage current flowing between the sources and the drains when the transistors are off.

In the offset correction circuit 72, the update frequency of the voltages $V_{CN}$ and $V_{CP}$ by the signal $S_{EN}$ can be reduced. Thus, the power consumption of the comparison circuit included in the analog-digital converter circuit can be reduced.

The offset correction circuit 72 using OS transistors can rewrite and read out analog voltages by charging and discharging charge, thereby obtaining and reading out analog voltages substantially without limit.

In the offset correction circuit 72 using the OS transistors, the OS transistors can be freely placed over a circuit using Si transistors or the like; thus, the offset correction circuit 72 can be easily integrated over the differential amplifier circuit 71 including Si transistors. Furthermore, an OS transistor can be fabricated with a manufacturing apparatus similar to that for a Si transistor and thus can be fabricated at low cost.

In addition, an OS transistor can be a four-terminal semiconductor element when having a back gate electrode in addition to a gate electrode, a source electrode, and a drain electrode. The OS transistor can be formed with an electric circuit network that can independently control input and output of signals flowing between a source and a drain depending on a voltage applied to the gate electrode or the back gate electrode. Thus, the circuit design can be made on the same concept as that for LSI. Furthermore, electrical characteristics of the OS transistor are better than those of a Si transistor in a high-temperature environment. Specifically, the ratio between an on-state current and an off-state current is large even at a high temperature higher than or equal to 125° C. and lower than or equal to 150° C.; thus, favorable switching operation can be performed.

Figure 9A:
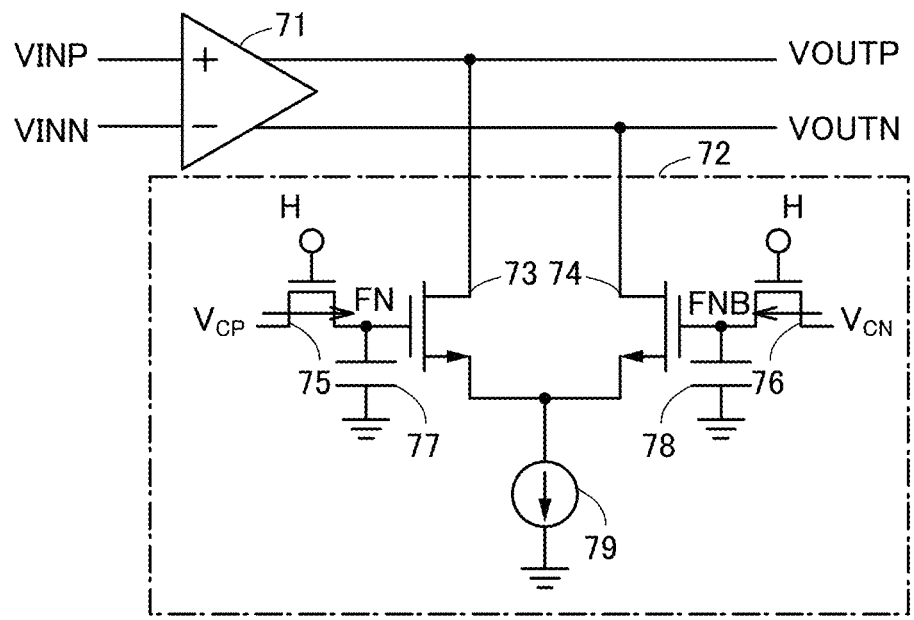
FIG. 9A and FIG. 9B are circuit diagrams illustrating a structure of an analog-digital converter circuit.
Figure 9B:
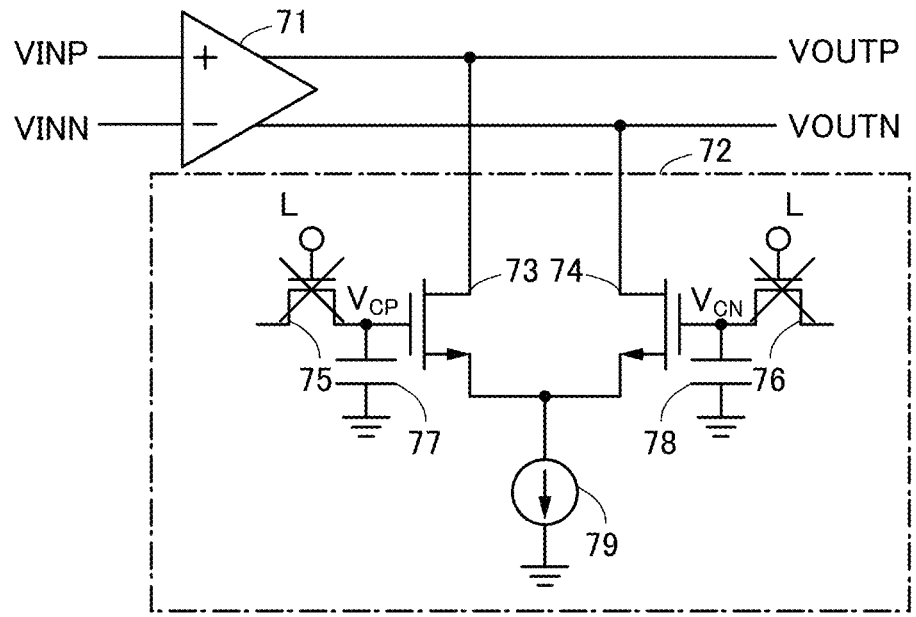

FIG. 9A and FIG. 9B are circuit diagrams illustrating operation of the offset correction circuit 72 illustrated in FIG. 8B. For simple description of diagrams illustrating operation in circuit diagrams in this specification and the like, transistors in an off state are marked with a cross and transistors in an on state are not marked with a cross.

FIG. 9A illustrates operation of writing the voltages $V_{CN}$ and $V_{CP}$ for correcting offset. In the writing operation, the signal $S_{EN}$ is set at an H level. Currents corresponding to the voltages $V_{CN}$ and $V_{CP}$ flow through the transistors 75 and 76. Charges corresponding to the voltages $V_{CN}$ and $V_{CP}$ are supplied to nodes FN and FNB to which the capacitors 77 and 78 are respectively connected. FIG. 9B illustrates operation of holding the voltages $V_{CN}$ and $V_{CP}$ for correcting offset. In the holding operation, the signal $S_{EN}$ is set at an L level. Since the transistors 75 and 76 are each turned off, current does not flow through the transistors 75 and 76. The charges corresponding to the voltages $V_{CN}$ and $V_{CP}$ are held in the nodes FN and FNB to which the capacitors 77 and 78 are respectively connected. In a period during which holding is performed, operation of correcting offset can be performed in accordance with the charges held in the nodes FN and FNB.

Figure 10:
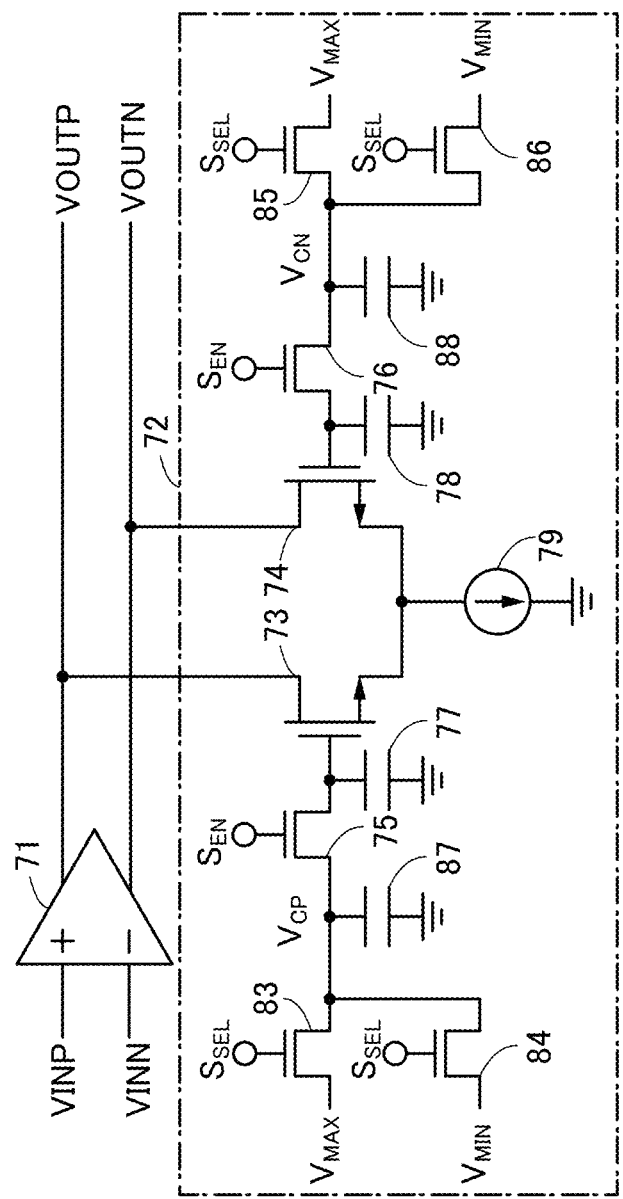
FIG. 10 is a circuit diagram illustrating a structure of an analog-digital converter circuit.

FIG. 10 illustrates a more specific circuit structure example of the offset correction circuit illustrated in FIG. 8B. FIG. 10 illustrates a structure including, in addition to the components illustrated in FIG. 8B, transistors 83 and 84, transistors 85 and 86, and capacitors 87 and 88. Voltages $V_{MAX}$ and $V_{MIN}$ are voltages for correcting offset. Note that the voltages $V_{MAX}$ and $V_{MIN}$ may be a plurality of voltages obtained by resistance division. The transistors 83 and 84 and the transistors 85 and 86 are voltages functioning as switches. A signal $S_{SEL}$ is a signal for controlling on/off of the transistors 83 and 84 and the transistors 85 and 86. The capacitors 87 and 88 have a function of holding the voltages $V_{CN}$ and $V_{CP}$ that are set in accordance with the signal $S_{SEL}$.

The transistors 83 and 84 and the transistors 85 and 86 may be Si transistors or OS transistors.

Figure 11:
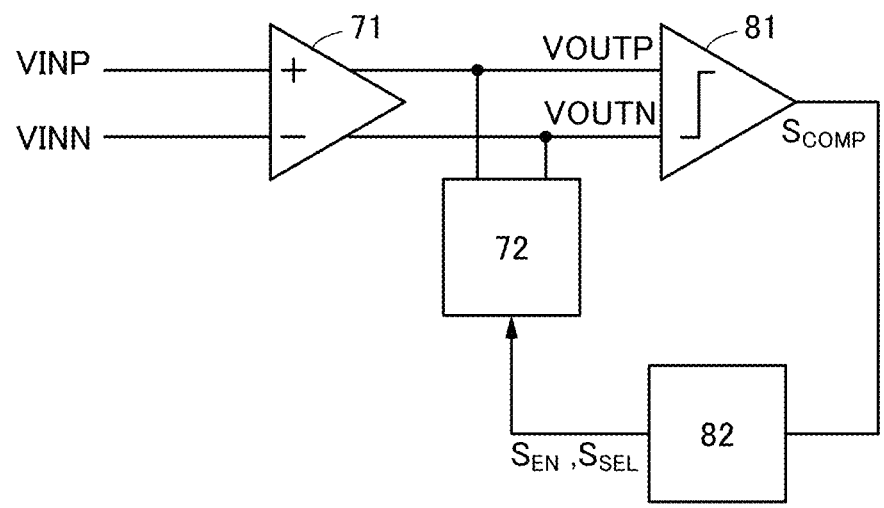
FIG. 11 is a circuit diagram illustrating a structure of an analog-digital converter circuit.

FIG. 11 is a diagram illustrating a signal generation circuit that generates the signals $S_{EN}$ and $S_{SEL}$ described with reference to FIG. 10.

FIG. 11 illustrates a comparator 81 and a signal generation circuit 82. The comparator 81 compares the voltages of the output terminals VOUTN and VOUTP and outputs a comparison result as a signal $S_{COMP}$. The signal generation circuit 82 generates the signals $S_{EN}$ and $S_{SEL}$ on the basis of the signal $S_{COMP}$. The signal generation circuit 82 monitors the signal $S_{COMP}$ and controls the signals $S_{EN}$ and $S_{SEL}$ such that the voltages of the output terminals VOUTN and VOUTP are balanced. When the output of the signals $S_{EN}$ and $S_{SEL}$ is intermittently stopped, the comparator 81 can be stopped, so that power consumption can be reduced.

Figure 12:
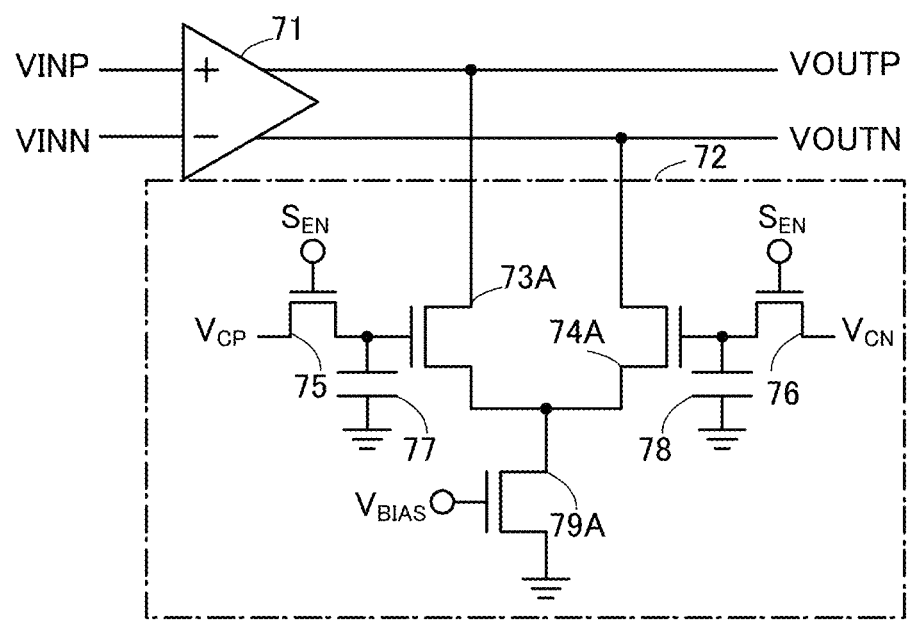
FIG. 12 is a circuit diagram illustrating a structure of an analog-digital converter circuit.
Figure 13A:
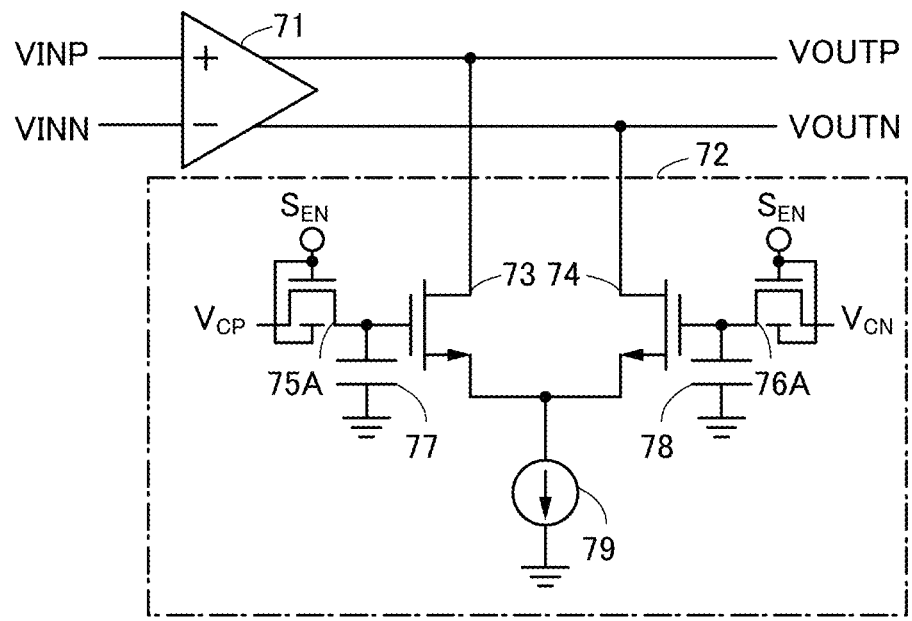
FIG. 13A and FIG. 13B are circuit diagrams illustrating a structure of an analog-digital converter circuit.
Figure 13B:
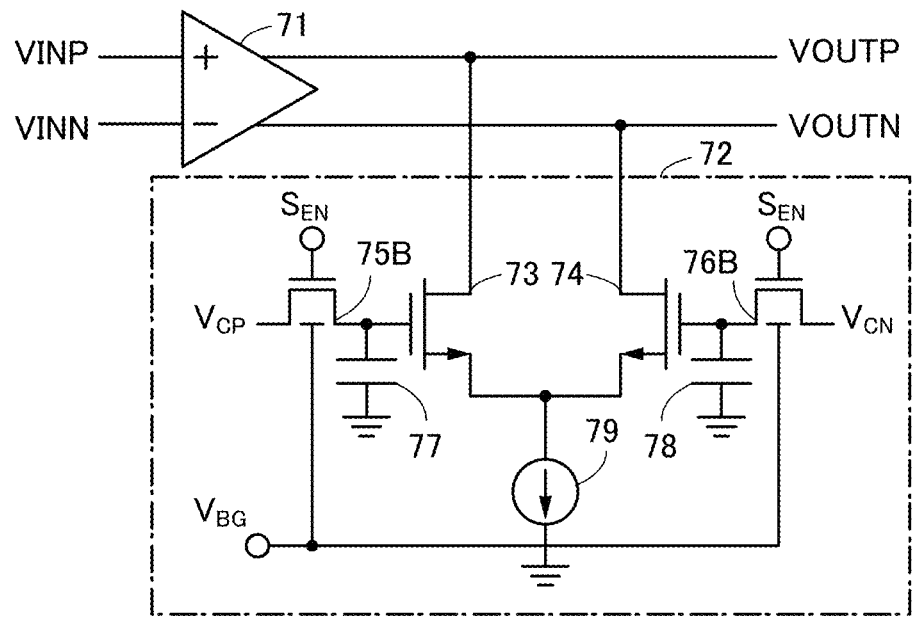

FIG. 12, FIG. 13A, and FIG. 13B are circuit diagrams illustrating modification examples of the analog-digital converter circuit 105 illustrated in FIG. 8B.

Although the transistors 73 and 74 are Si transistors in FIG. 8B, OS transistors may be used. FIG. 12 is a circuit diagram in which the transistors 73 and 74 are replaced with transistors 73A and 74A, which are OS transistors. FIG. 12 is a circuit diagram in which the constant current circuit 79 is replaced with a transistor 75A, which is an OS transistor, and a bias voltage $V_{BIAS}$ is applied to a gate of the transistor 75A. Since a layer including an OS transistor can be stacked over a layer where a Si transistor is provided, the circuit scale can be small.

In FIG. 8B, each transistor is illustrated as a transistor having a top-gate structure or a bottom-gate structure without a back gate electrode; however, the structures of the transistors are not limited thereto. For example, as illustrated in FIG. 13A, the transistors 75A and 75A each including a back gate electrode connected to a gate electrode may be used. With the structure of FIG. 13A, the amount of current flowing through the transistors can be increased.

Alternatively, as illustrated in FIG. 13B, transistors 75B and 76B each including a back gate electrode connected to a terminal that applies the back gate voltage $V_{BG}$ may be used. With the structure of FIG. 13B, electrical characteristics such as the threshold voltages of the transistors can be easily controlled from the outside.

The composition, structure, method, and the like described in this embodiment can be used in combination as appropriate with the compositions, structures, methods, and the like described in the other embodiments, the example, and the like.

Embodiment 4

In this embodiment, structures of transistors that can be used in the semiconductor device described in the above embodiments will be described. For example, a structure in which transistors having different electrical characteristics are stacked will be described. With the structure, the degree of freedom in design of the semiconductor device can be increased. Stacking transistors having different electrical characteristics can increase the degree of integration of the semiconductor device.

Figure 14:
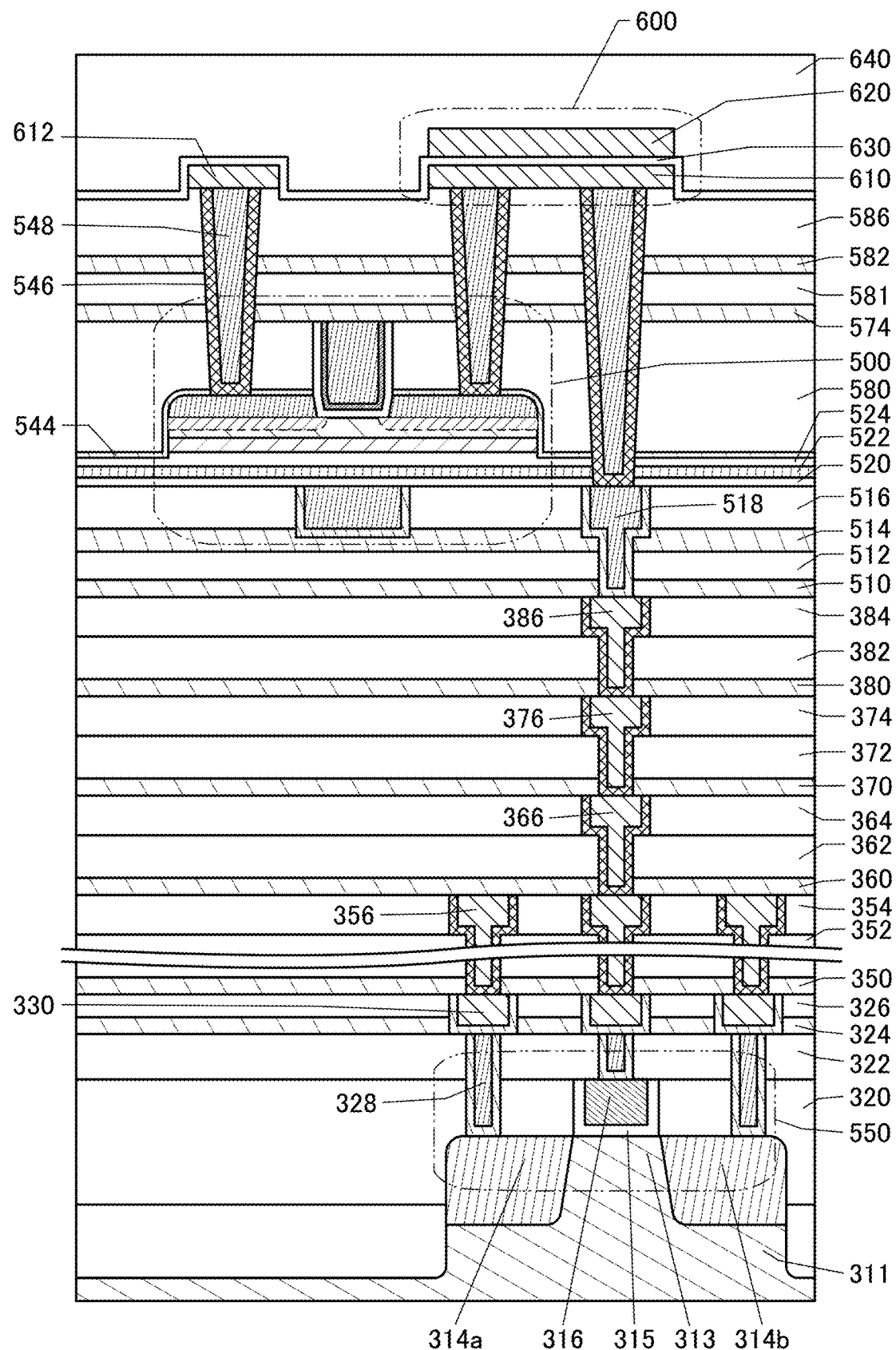
FIG. 14 is a diagram illustrating a structure example of a semiconductor device.
Figure 16A:
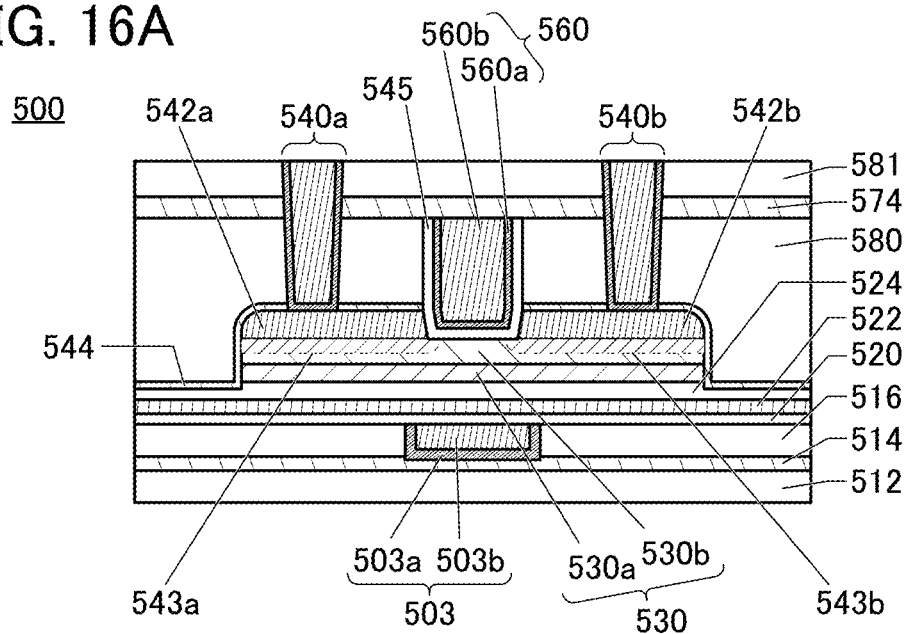
FIG. 16A to FIG. 16C are diagrams illustrating a transistor structure example.
Figure 16B:
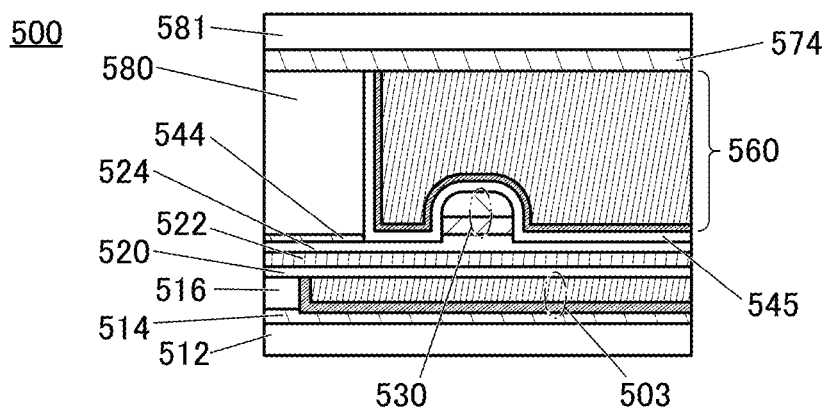
Figure 16C:
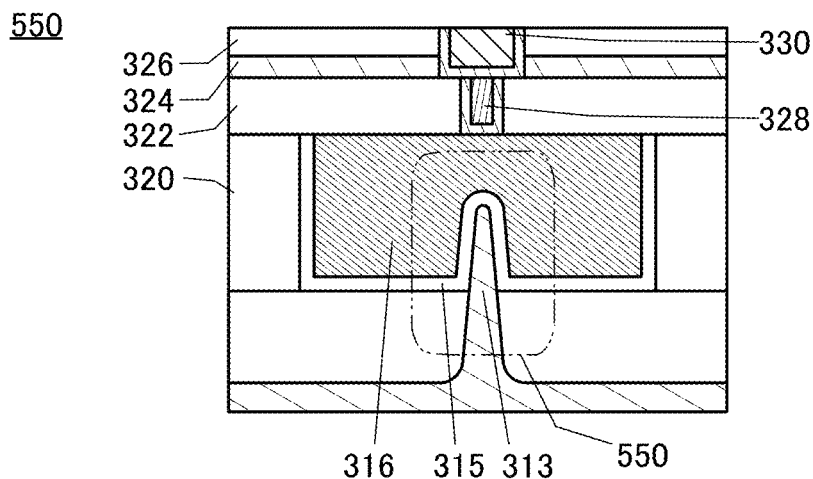

FIG. 14 illustrates part of a cross-sectional structure of a semiconductor device. A semiconductor device illustrated in FIG. 14 includes a transistor 550, a transistor 500, and a capacitor 600. FIG. 16A is a cross-sectional view of the transistor 500 in the channel length direction, FIG. 16B is a cross-sectional view of the transistor 500 in the channel width direction, and FIG. 16C is a cross-sectional view of the transistor 550 in the channel width direction. For example, the transistor 500 and the transistor 550 correspond to the transistors 43 to 48 and the transistors 35 and 36, respectively, described in the above embodiment. The capacitor 600 corresponds to the capacitors 41 and 42.

The transistor 500 is an OS transistor.

In FIG. 14, the transistor 500 is provided above the transistor 550, and the capacitor 600 is provided above the transistor 550 and the transistor 500.

The transistor 550 is provided over a substrate 311 and includes a conductor 316, an insulator 315, a semiconductor region 313 that is part of the substrate 311, and a low-resistance region 314a and a low-resistance region 314b functioning as a source region and a drain region.

As illustrated in FIG. 16C, in the transistor 550, a top surface and a side surface in the channel width direction of the semiconductor region 313 are covered with the conductor 316 with the insulator 315 therebetween. Such a Fin-type transistor 550 can have an increased effective channel width, and thus have improved on-state characteristics. In addition, since contribution of an electric field of a gate electrode can be increased, the off-state characteristics of the transistor 550 can be improved.

Note that the transistor 550 can be either a p-channel transistor or an n-channel transistor.

A region of the semiconductor region 313 where a channel is formed, a region in the vicinity thereof, the low-resistance region 314a and the low-resistance region 314b functioning as a source region and a drain region, and the like preferably contain a semiconductor such as a silicon-based semiconductor, and preferably contain single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and changing the lattice spacing is used. Alternatively, the transistor 550 may be an HEMT (High Electron Mobility Transistor) with the use of GaAs and GaAlAs, or the like.

The low-resistance region 314*a* and the low-resistance region 314*b* contain an element that imparts n-type conductivity, such as arsenic or phosphorus, or an element that imparts p-type conductivity, such as boron, in addition to the semiconductor material used for the semiconductor region 313.

For the conductor 316 functioning as a gate electrode, a semiconductor material such as silicon containing the element that imparts n-type conductivity, such as arsenic or phosphorus, or the element that imparts p-type conductivity, such as boron, or a conductive material such as a metal material, an alloy material, or a metal oxide material can be used.

Note that the work function depends on a material for a conductor; therefore, selecting the material for the conductor can adjust the threshold voltage of the transistor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

The transistor 550 may be formed using an SOI (Silicon on Insulator) substrate, for example.

As the SOI substrate, the following substrate may be used: an SIMOX (Separation by Implanted Oxygen) substrate formed in such a manner that after an oxygen ion is implanted into a mirror-polished wafer, an oxide layer is formed at a certain depth from the surface and defects generated in a surface layer are eliminated by high-temperature annealing; or an SOI substrate formed by a Smart-Cut method in which a semiconductor substrate is cleaved by utilizing growth of a minute void, which is formed by implantation of a hydrogen ion, by heat treatment, an ELTRAN method (registered trademark: Epitaxial Layer Transfer), or the like. A transistor formed using a single crystal substrate contains a single crystal semiconductor in a channel formation region.

Figure 15:
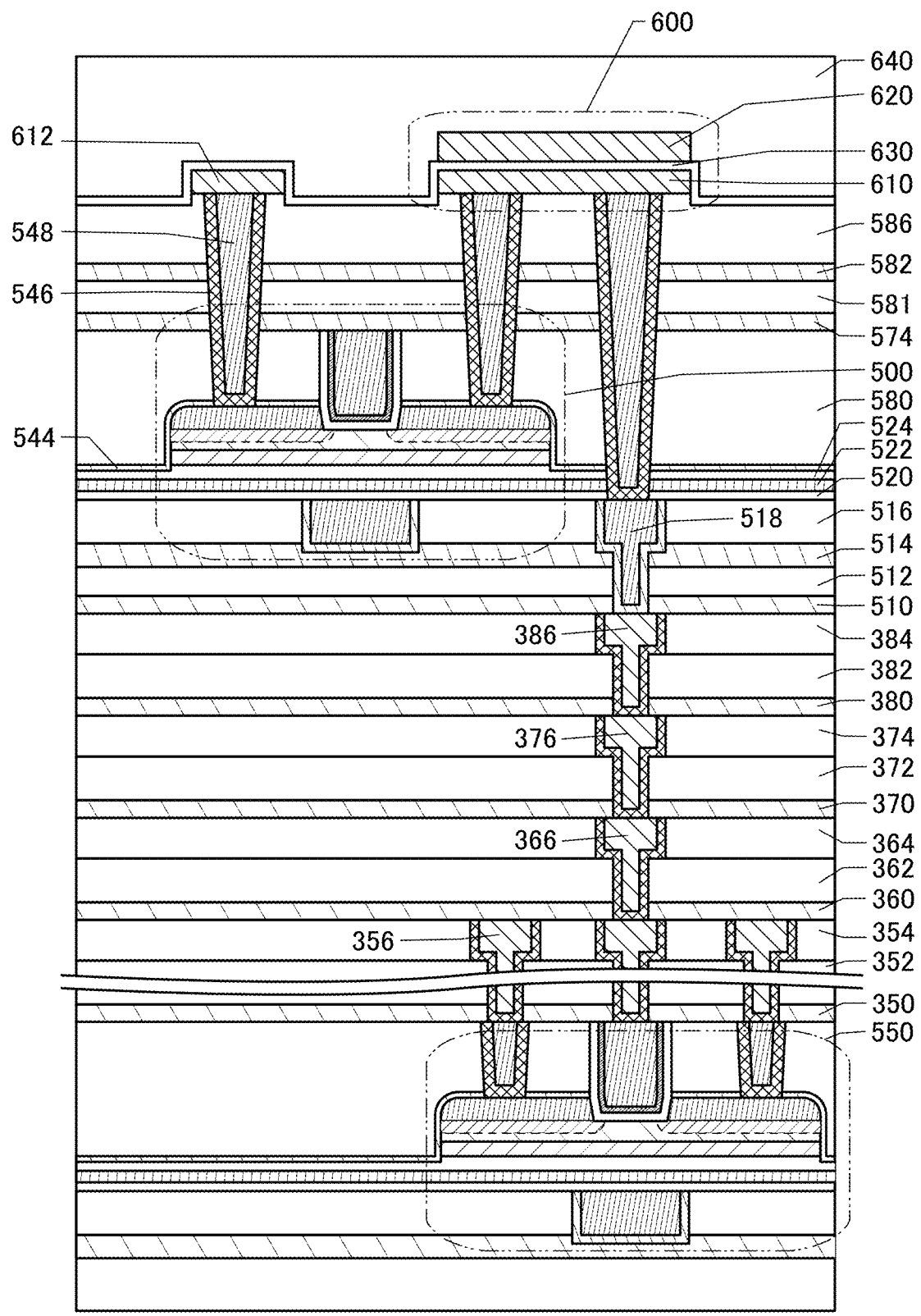
FIG. 15 is a diagram illustrating a structure example of a semiconductor device.

Note that the transistor 550 illustrated in FIG. 14 is an example and the structure is not limited thereto; an appropriate transistor can be used in accordance with a circuit structure or a driving method. For example, when the semiconductor device is a single-polarity circuit using only OS transistors (which mean transistors having the same polarity, e.g., only n-channel transistors), the transistor 550 has a structure similar to that of the transistor 500 as illustrated in FIG. 15. Note that the details of the transistor 500 will be described later.

An insulator 320, an insulator 322, an insulator 324, and an insulator 326 are stacked in this order to cover the transistor 550.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, aluminum nitride, or the like is used, for example.

Note that in this specification, silicon oxynitride refers to a material that contains oxygen at a higher proportion than nitrogen, and silicon nitride oxide refers to a material that contains nitrogen at a higher proportion than oxygen. Furthermore, in this specification, aluminum oxynitride refers to a material that contains oxygen at a higher proportion than nitrogen, and aluminum nitride oxide refers to a material that contains nitrogen at a higher proportion than oxygen.

The insulator 322 may have a function of a planarization film for eliminating a level difference caused by the transistor 550 or the like provided below the insulator 322. For example, a top surface of the insulator 322 may be planarized by planarization treatment using a chemical mechanical polishing (CMP) method or the like to increase planarity.

For the insulator 324, it is preferable to use a film having a barrier property that prevents diffusion of hydrogen or impurities from the substrate 311, the transistor 550, or the like into a region where the transistor 500 is provided.

For the film having a barrier property against hydrogen, silicon nitride formed by a CVD method can be used, for example. Here, diffusion of hydrogen to a semiconductor element including an oxide semiconductor, such as the transistor 500, degrades the characteristics of the semiconductor element in some cases. Thus, a film that inhibits hydrogen diffusion is preferably provided between the transistor 500 and the transistor 550. The film that inhibits hydrogen diffusion is specifically a film from which a small amount of hydrogen is released.

The amount of released hydrogen can be analyzed by thermal desorption spectroscopy (TDS) or the like, for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less the dielectric constant of the insulator 324. When a material with a low permittivity is used for an interlayer film, parasitic capacitance generated between wirings can be reduced.

A conductor 328, a conductor 330, and the like that are connected to the capacitor 600 or the transistor 500 are embedded in the insulator 320, the insulator 322, the insulator 324, and the insulator 326. Note that the conductor 328 and the conductor 330 each have a function of a plug or a wiring. Furthermore, a plurality of conductors functioning as plugs or wirings are collectively denoted by the same reference numeral in some cases. Moreover, in this specification and the like, a wiring and a plug connected to the wiring may be a single component. That is, part of a conductor functions as a wiring in some cases, and part of a conductor functions as a plug in other cases.

As a material for each of the plugs and wirings (the conductor 328, the conductor 330, and the like), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to form the plugs and wirings with a low-resistance conductive material such as aluminum or copper. The use of a low-resistance conductive material can reduce wiring resistance.

A wiring layer may be provided over the insulator 326 and the conductor 330. For example, in FIG. 14, an insulator 350, an insulator 352, and an insulator 354 are stacked in this order. Furthermore, a conductor 356 is formed in the insulator 350, the insulator 352, and the insulator 354. The conductor 356 has a function of a plug or a wiring that is connected to the transistor 550. Note that the conductor 356 can be provided using a material similar to those for the conductor 328 and the conductor 330.

For example, like the insulator 324, the insulator 350 is preferably formed using an insulator having a barrier property against hydrogen. Furthermore, the conductor 356 preferably includes a conductor having a barrier property against hydrogen. In particular, the conductor having a barrier property against hydrogen is formed in an opening portion of the insulator 350 having a barrier property against hydrogen. With this structure, the transistor 550 and the transistor 500 can be separated by a barrier layer, so that diffusion of hydrogen from the transistor 550 into the transistor 500 can be inhibited.

Note that for the conductor having a barrier property against hydrogen, tantalum nitride is preferably used, for example. In addition, by stacking tantalum nitride and tungsten, which has high conductivity, the diffusion of hydrogen from the transistor 550 can be inhibited while the conductivity of a wiring is kept. In that case, a structure in which a tantalum nitride layer having a barrier property against hydrogen is in contact with the insulator 350 having a barrier property against hydrogen is preferable.

A wiring layer may be provided over the insulator 354 and the conductor 356. For example, in FIG. 14, an insulator 360, an insulator 362, and an insulator 364 are stacked in this order. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

For example, like the insulator 324, the insulator 360 is preferably formed using an insulator having a barrier property against hydrogen. Furthermore, the conductor 366 preferably includes a conductor having a barrier property against hydrogen. In particular, the conductor having a barrier property against hydrogen is formed in an opening portion of the insulator 360 having a barrier property against hydrogen. With this structure, the transistor 550 and the transistor 500 can be separated by a barrier layer, so that diffusion of hydrogen from the transistor 550 into the transistor 500 can be inhibited.

A wiring layer may be provided over the insulator 364 and the conductor 366. For example, in FIG. 14, an insulator 370, an insulator 372, and an insulator 374 are stacked in this order. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

For example, like the insulator 324, the insulator 370 is preferably formed using an insulator having a barrier property against hydrogen. Furthermore, the conductor 376 preferably includes a conductor having a barrier property against hydrogen. In particular, the conductor having a barrier property against hydrogen is formed in an opening portion of the insulator 370 having a barrier property against hydrogen. With this structure, the transistor 550 and the transistor 500 can be separated by a barrier layer, so that diffusion of hydrogen from the transistor 550 into the transistor 500 can be inhibited.

A wiring layer may be provided over the insulator 374 and the conductor 376. For example, in FIG. 14, an insulator 380, an insulator 382, and an insulator 384 are stacked in this order. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

For example, like the insulator 324, the insulator 380 is preferably formed using an insulator having a barrier property against hydrogen. Furthermore, the conductor 386 preferably includes a conductor having a barrier property against hydrogen. In particular, the conductor having a barrier property against hydrogen is formed in an opening portion of the insulator 380 having a barrier property against hydrogen. With this structure, the transistor 550 and the transistor 500 can be separated by a barrier layer, so that diffusion of hydrogen from the transistor 550 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are stacked in this order over the insulator 384. A substance having a barrier property against oxygen or hydrogen is preferably used for any of the insulator 510, the insulator 512, the insulator 514, and the insulator 516.

For example, for the insulator 510 and the insulator 514, it is preferable to use a film having a barrier property that prevents diffusion of hydrogen or impurities from the substrate 311, a region where the transistor 550 is provided, or the like into the region where the transistor 500 is provided. Thus, a material similar to that for the insulator 324 can be used.

For the film having a barrier property against hydrogen, silicon nitride formed by a CVD method can be used, for example. Here, diffusion of hydrogen to a semiconductor element including an oxide semiconductor, such as the transistor 500, degrades the characteristics of the semiconductor element in some cases. Thus, a film that inhibits hydrogen diffusion is preferably provided between the transistor 500 and the transistor 550. The film that inhibits hydrogen diffusion is specifically a film from which a small amount of hydrogen is released.

In addition, for the film having a barrier property against hydrogen, a metal oxide such as aluminum oxide, hafnium oxide, or tantalum oxide is preferably used for the insulator 510 and the insulator 514, for example.

In particular, aluminum oxide has an excellent blocking effect that prevents the passage of both oxygen and impurities such as hydrogen and moisture which are factors of change in electrical characteristics of the transistor. Accordingly, aluminum oxide can prevent entry of impurities such as hydrogen and moisture into the transistor 500 in the manufacturing process and after the manufacture of the transistor. In addition, release of oxygen from the oxide included in the transistor 500 can be inhibited. Therefore, aluminum oxide is suitably used for a protective film of the transistor 500.

For the insulator 512 and the insulator 516, a material similar to that for the insulator 320 can be used, for example. Furthermore, when a material with a comparatively low permittivity is used for these insulators, parasitic capacitance generated between wirings can be reduced. A silicon oxide film, a silicon oxynitride film, or the like can be used for the insulator 512 and the insulator 516, for example.

Furthermore, a conductor 518, a conductor included in the transistor 500 (e.g., a conductor 503), and the like are embedded in the insulator 510, the insulator 512, the insulator 514, and the insulator 516. Note that the conductor 518 has a function of a plug or a wiring that is connected to the capacitor 600 or the transistor 550. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With this structure, the transistor 550 and the transistor 500 can be separated by a layer having a barrier property against oxygen, hydrogen, and water; thus, diffusion of hydrogen from the transistor 550 into the transistor 500 can be inhibited.

The transistor 500 is provided above the insulator 516.

As illustrated in FIG. 16A and FIG. 16B, the transistor 500 includes the conductor 503 positioned to be embedded in the insulator 514 and the insulator 516; an insulator 520 positioned over the insulator 516 and the conductor 503; an insulator 522 positioned over the insulator 520; an insulator 524 positioned over the insulator 522; an oxide 530*a* positioned over the insulator 524; an oxide 530*b* positioned over the oxide 530*a*; a conductor 542*a* and a conductor 542*b* positioned apart from each other over the oxide 530*b*; an insulator 580 that is positioned over the conductor 542*a* and the conductor 542*b* and is provided with an opening formed to overlap with a region between the conductor 542*a* and the conductor 542*b*; an insulator 545 positioned on a bottom surface and a side surface of the opening; and a conductor 560 positioned on a formation surface of the insulator 545.

In addition, as illustrated in FIG. 16A and FIG. 16B, an insulator 544 is preferably positioned between the insulator 580 and the oxide 530*a*, the oxide 530*b*, the conductor 542*a*, and the conductor 542*b*. Furthermore, as illustrated in FIG. 16A and FIG. 16B, the conductor 560 preferably includes a conductor 560*a* provided on the inner side of the insulator 545 and a conductor 560*b* provided to be embedded on the inner side of the conductor 560*a*. Moreover, as illustrated in FIG. 16A and FIG. 16B, an insulator 574 is preferably positioned over the insulator 580, the conductor 560, and the insulator 545.

Note that in this specification and the like, the oxide 530*a* and the oxide 530*b* are sometimes collectively referred to as an oxide 530.

Note that although a structure of the transistor 500 in which two layers of the oxide 530*a* and the oxide 530*b* are stacked in a region where a channel is formed and its vicinity is illustrated, the present invention is not limited thereto. For example, it is possible to employ a structure in which a single layer of the oxide 530*b* or a stacked-layer structure of three or more layers is provided.

Furthermore, although the conductor 560 is illustrated to have a stacked-layer structure of two layers in the transistor 500, the present invention is not limited thereto. For example, the conductor 560 may have a single-layer structure or a stacked-layer structure of three or more layers. The transistor 500 illustrated in FIG. 14, FIG. 15, and FIG. 16A is an example, and the structure is not limited thereto; an appropriate transistor can be used in accordance with a circuit structure, a driving method, or the like.

Here, the conductor 560 functions as a gate electrode of the transistor, and the conductor 542*a* and the conductor 542*b* function as a source electrode and a drain electrode. As described above, the conductor 560 is formed to be embedded in the opening of the insulator 580 and the region between the conductor 542*a* and the conductor 542*b*. The positions of the conductor 560, the conductor 542*a*, and the conductor 542*b* with respect to the opening of the insulator 580 are selected in a self-aligned manner. That is, in the transistor 500, the gate electrode can be positioned between the source electrode and the drain electrode in a self-aligned manner. Therefore, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542*a* and the conductor 542*b* in a self-aligned manner, the conductor 560 does not have a region overlapping with the conductor 542*a* or the conductor 542*b*. Thus, parasitic capacitance formed between the conductor 560 and each of the conductor 542*a* and the conductor 542*b* can be reduced. As a result, the switching speed of the transistor 500 can be improved, and the transistor 500 can have high frequency characteristics.

The conductor 560 functions as a first gate (also referred to as top gate) electrode in some cases. The conductor 503 functions as a second gate (also referred to as bottom gate) electrode in some cases. In such cases, the threshold voltage of the transistor 500 can be controlled by changing a potential applied to the conductor 503 independently of a potential applied to the conductor 560. In particular, the threshold voltage of the transistor 500 can be higher than 0 V and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied.

The conductor 503 is positioned to overlap with the oxide 530 and the conductor 560. Thus, in the case where potentials are applied to the conductor 560 and the conductor 503, an electric field generated from the conductor 560 and an electric field generated from the conductor 503 are connected, so that a channel formation region formed in the oxide 530 can be covered.

In this specification and the like, a transistor structure in which a channel formation region is electrically surrounded by electric fields of a pair of gate electrodes (a first gate electrode and a second gate electrode) is referred to as a surrounded channel (S-channel) structure. Furthermore, in this specification and the like, the surrounded channel (S-channel) structure has a feature in that the side surface and the vicinity of the oxide 530 that is in contact with the conductor 542*a* and the conductor 542*b* functioning as the source electrode and the drain electrode are of I-type like the channel formation region. Since the side surface and the vicinity of the oxide 530 that is in contact with the conductor 542*a* and the conductor 542*b* are in contact with the insulator 544, they can be of I-type like the channel formation region. Note that in this specification and the like, "I-type" can be equated with "highly purified intrinsic" to be described later. The S-channel structure disclosed in this specification and the like is different from a Fin-type structure and a planar structure. With the S-channel structure, resistance to a short-channel effect can be enhanced, that is, a transistor in which a short-channel effect is unlikely to occur can be provided.

In addition, the conductor 503 has a structure similar to that of the conductor 518; a conductor 503a is formed in contact with an inner wall of an opening in the insulator 514 and the insulator 516, and a conductor 503b is formed on the inner side. Note that although the transistor 500 having a structure in which the conductor 503a and the conductor 503b are stacked is illustrated, the present invention is not limited thereto. For example, the conductor 503 may be provided as a single layer or to have a stacked-layer structure of three or more layers.

Here, for the conductor 503a, a conductive material that has a function of inhibiting diffusion of impurities such as a hydrogen atom, a hydrogen molecule, a water molecule, and a copper atom (through which the impurities are unlikely to pass) is preferably used. Alternatively, it is preferable to use a conductive material that has a function of inhibiting diffusion of oxygen (e.g., at least one of an oxygen atom, an oxygen molecule, and the like) (through which oxygen is unlikely to pass). Note that in this specification, a function of inhibiting diffusion of impurities or oxygen means a function of inhibiting diffusion of any one or all of the impurities and oxygen.

For example, when the conductor 503a has a function of inhibiting diffusion of oxygen, a reduction in conductivity of the conductor 503b due to oxidation can be inhibited.

In addition, in the case where the conductor 503 also functions as a wiring, a conductive material with high conductivity that contains tungsten, copper, or aluminum as its main component is preferably used for the conductor 503b. Note that although the conductor 503 has a stacked layer of the conductor 503a and the conductor 503b in this embodiment, the conductor 503 may have a single-layer structure.

The insulator 520, the insulator 522, and the insulator 524 have a function of a second gate insulating film.

Here, as the insulator 524 that is in contact with the oxide 530, an insulator that contains oxygen more than oxygen in the stoichiometric composition is preferably used. Such oxygen is easily released from the insulator by heating. In this specification and the like, oxygen released by heating is sometimes referred to as excess oxygen. That is, a region containing excess oxygen (also referred to as an excess-oxygen region) is preferably formed in the insulator 524. When such an insulator containing excess oxygen is provided in contact with the oxide 530, oxygen vacancies ($V_O$) in the oxide 530 can be reduced and the reliability of the transistor 500 can be improved. When hydrogen enters the oxygen vacancies in the oxide 530, such defects (hereinafter, referred to as $V_OH$ in some cases) serve as donors and generate electrons serving as carriers in some cases. In other cases, bonding of part of hydrogen to oxygen bonded to a metal atom generates electrons serving as carriers. Thus, a transistor including an oxide semiconductor that contains a large amount of hydrogen is likely to have normally-on characteristics. Moreover, hydrogen in an oxide semiconductor is easily transferred by stress such as heat or an electric field; thus, a large amount of hydrogen in an oxide semiconductor might reduce the reliability of the transistor. In one embodiment of the present invention, $V_OH$ in the oxide 530 is preferably reduced as much as possible so that the oxide 530 becomes a highly purified intrinsic or substantially highly purified intrinsic oxide. It is important to remove impurities such as moisture and hydrogen in an oxide semiconductor (also described as "dehydration" or "dehydrogenation treatment") and supply oxygen to the oxide semiconductor to fill oxygen vacancies (also described as "oxygen adding treatment") in order to obtain an oxide semiconductor whose $V_OH$ is sufficiently reduced. When an oxide semiconductor with sufficiently reduced impurities such as $V_OH$ is used for a channel formation region of a transistor, the transistor can have stable electrical characteristics.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably within the range of 100° C. to 700° C., or 100° C. to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when a reaction in which a bond of $V_OH$ is cut occurs, i.e., a reaction of $V_OH \rightarrow V_O + H$ occurs. Part of hydrogen generated at this time is bonded to oxygen to be $H_2O$, and removed from the oxide 530 or an insulator near the oxide 530 in some cases. Part of hydrogen is gettered by the conductor 542 in other cases.

For the microwave treatment, for example, an apparatus including a power supply that generates high-density plasma or an apparatus including a power supply that applies RF to the substrate side is suitably used. For example, the use of an oxygen-containing gas and high-density plasma enables high-density oxygen radicals to be generated, and application of the RF to the substrate side allows the oxygen radicals generated by the high-density plasma to be efficiently introduced into the oxide 530 or an insulator near the oxide 530. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ($O_2/(O_2+Ar)$) is lower than or equal to 50%, preferably higher than or equal to 10% and lower than or equal to 30%.

In a manufacturing process of the transistor 500, heat treatment is preferably performed with the surface of the oxide 530 exposed. The heat treatment is performed at higher than or equal to 100° C. and lower than or equal to 450° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies ($V_O$). The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that the oxygen adding treatment performed on the oxide 530 can promote a reaction in which oxygen vacancies in the oxide 530 are filled with supplied oxygen, i.e., a reaction of $V_O+O \rightarrow null$. Furthermore, hydrogen remaining in the oxide 530 reacts with supplied oxygen, so that the hydrogen can be removed as $H_2O$ (dehydration). This can inhibit recombination of hydrogen remaining in the oxide 530 with oxygen vacancies and formation of $V_OH$.

In addition, in the case where the insulator 524 includes an excess-oxygen region, it is preferable that the insulator 522 have a function of inhibiting diffusion of oxygen (e.g., an oxygen atom, an oxygen molecule, or the like) (through which oxygen is unlikely to pass).

The insulator 522 preferably has a function of inhibiting diffusion of oxygen or impurities, in which case oxygen contained in the oxide 530 is not diffused to the insulator 520 side. Furthermore, the conductor 503 can be inhibited from reacting with oxygen contained in the insulator 524 or the oxide 530.

For the insulator 522, it is preferable to use a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST), for example. As miniaturization and high integration of transistors progress, a problem such as leakage current might arise because of a thinner gate insulating film. When a high-k material is used for an insulator functioning as the gate insulating film, a gate potential during transistor operation can be reduced while the physical thickness is maintained.

It is particularly preferable to use an insulator containing an oxide of one or both of aluminum and hafnium, which is an insulating material having a function of inhibiting diffusion of impurities, oxygen, and the like (through which oxygen is unlikely to pass). Aluminum oxide, hafnium oxide, an oxide containing aluminum and hafnium (hafnium aluminate), or the like is preferably used as the insulator containing an oxide of one or both of aluminum and hafnium. In the case where the insulator 522 is formed using such a material, the insulator 522 functions as a layer that inhibits release of oxygen from the oxide 530 and entry of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. The insulator over which silicon oxide, silicon oxynitride, or silicon nitride is stacked may be used.

In addition, it is preferable that the insulator 520 be thermally stable. For example, silicon oxide and silicon oxynitride are suitable because they are thermally stable. Furthermore, the combination of an insulator that is a high-k material and silicon oxide or silicon oxynitride enables the insulator 520 and an insulator 526 to have a stacked-layer structure that has thermal stability and a high dielectric constant.

Note that in the transistor 500 in FIG. 16A and FIG. 16B, the insulator 520, the insulator 522, and the insulator 524 are illustrated as the second gate insulating film having a stacked-layer structure of three layers; however, the second gate insulating film may be a single layer or may have a stacked-layer structure of two layers or four or more layers. In such cases, without limitation to a stacked-layer structure formed of the same material, a stacked-layer structure formed of different materials may be employed.

In the transistor 500, a metal oxide functioning as an oxide semiconductor is used as the oxide 530 including a channel formation region. For example, as the oxide 530, a metal oxide such as an In-M-Zn oxide (an element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used.

The metal oxide functioning as an oxide semiconductor may be formed by a sputtering method or an ALD (Atomic Layer Deposition) method. Note that the metal oxide functioning as an oxide semiconductor will be described in detail in another embodiment.

The metal oxide functioning as the channel formation region in the oxide 530 has a band gap of 2 eV or more, preferably 2.5 eV or more. With the use of a metal oxide having such a wide band gap, the off-state current of the transistor can be reduced.

When the oxide 530 includes the oxide 530a under the oxide 530b, it is possible to inhibit diffusion of impurities into the oxide 530b from the components formed below the oxide 530a.

Note that the oxide 530 preferably has a stacked-layer structure of a plurality of oxide layers that differ in the atomic ratio of metal atoms. Specifically, the atomic ratio of the element M to the constituent elements in the metal oxide used as the oxide 530a is preferably higher than the atomic ratio of the element M to the constituent elements in the metal oxide used as the oxide 530b. In addition, the atomic ratio of the element M to In in the metal oxide used as the oxide 530a is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530a.

The energy of the conduction band minimum of the oxide 530a is preferably higher than the energy of the conduction band minimum of the oxide 530b. In other words, the electron affinity of the oxide 530a is preferably smaller than the electron affinity of the oxide 530b.

Here, the energy level of the conduction band minimum gently changes at a junction portion between the oxide 530a and the oxide 530b. In other words, the energy level of the conduction band minimum at the junction portion between the oxide 530a and the oxide 530b continuously changes or is continuously connected. To obtain this, the density of defect states in a mixed layer formed at the interface between the oxide 530a and the oxide 530b is preferably made low.

Specifically, when the oxide 530a and the oxide 530b contain a common element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is preferably used as the oxide 530a.

At this time, the oxide 530b serves as a main carrier path. When the oxide 530a has the above structure, the density of defect states at the interface between the oxide 530a and the oxide 530b can be made low. Thus, the influence of interface scattering on carrier conduction is small, and the transistor 500 can have a high on-state current.

The conductor 542a and the conductor 542b functioning as the source electrode and the drain electrode are provided over the oxide 530b. For the conductor 542a and the conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements as its component; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film of tantalum nitride or the like is preferable because it has a barrier property against hydrogen or oxygen.

In addition, although the conductor 542a and the conductor 542b each having a single-layer structure are illustrated in FIG. 16, a stacked-layer structure of two or more layers may be employed. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed thereover; and a three-layer structure where a molybdenum film or a molybdenum nitride film is formed, an aluminum film or a copper film is stacked over the molybdenum film or the molybdenum nitride film, and a molybdenum film or a molybdenum nitride film is formed thereover. Note that a transparent conductive material containing indium oxide, tin oxide, or zinc oxide may be used.

In addition, as illustrated in FIG. 16A, a region 543a and a region 543b are sometimes formed as low-resistance regions at and near an interface between the oxide 530 and the conductor 542a (the conductor 542b). In that case, the region 543a functions as one of a source region and a drain region, and the region 543b functions as the other of the source region and the drain region. Furthermore, the channel formation region is formed in a region between the region 543a and the region 543b.

When the conductor 542a (the conductor 542b) is provided to be in contact with the oxide 530, the oxygen concentration in the region 543a (the region 543b) sometimes decreases. In addition, a metal compound layer that contains the metal contained in the conductor 542a (the conductor 542b) and the component of the oxide 530 is sometimes formed in the region 543a (the region 543b). In such a case, the carrier density of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. At this time, the insulator 544 may be provided to cover a side surface of the oxide 530 and to be in contact with the insulator 524.

A metal oxide containing one kind or two or more kinds selected from hafnium, aluminum, gallium, yttrium, zirconium, tungsten, titanium, tantalum, nickel, germanium, neodymium, lanthanum, magnesium, and the like can be used as the insulator 544. Alternatively, silicon nitride oxide, silicon nitride, or the like can be used for the insulator 544.

It is particularly preferable to use an insulator containing an oxide of one or both of aluminum and hafnium, such as aluminum oxide, hafnium oxide, or an oxide containing aluminum and hafnium (hafnium aluminate), as the insulator 544. In particular, hafnium aluminate has higher heat resistance than a hafnium oxide film. Therefore, hafnium aluminate is preferable because it is unlikely to be crystallized by heat treatment in a later step. Note that the insulator 544 is not an essential component when the conductor 542a and the conductor 542b are oxidation-resistant materials or do not significantly lose their conductivity even after absorbing oxygen. Design is appropriately set in consideration of required transistor characteristics.

When the insulator 544 is included, diffusion of impurities such as water and hydrogen contained in the insulator 580 into the oxide 530b through the insulator 545 can be inhibited. Furthermore, oxidation of the conductor 560 due to excess oxygen contained in the insulator 580 can be inhibited.

The insulator 545 functions as a first gate insulating film. Like the insulator 524, the insulator 545 is preferably formed using an insulator that contains excess oxygen and releases oxygen by heating.

Specifically, any of silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide, each of which contains excess oxygen, can be used. In particular, silicon oxide and silicon oxynitride are preferable because they are thermally stable.

When an insulator containing excess oxygen is provided as the insulator 545, oxygen can be effectively supplied from the insulator 545 to the channel formation region of the oxide 530b. As in the insulator 524, the concentration of impurities such as water and hydrogen in the insulator 545 is preferably reduced. The thickness of the insulator 545 is preferably greater than or equal to 1 nm and less than or equal to 20 nm.

To efficiently supply excess oxygen contained in the insulator 545 to the oxide 530, a metal oxide may be provided between the insulator 545 and the conductor 560. The metal oxide preferably inhibits diffusion of oxygen from the insulator 545 to the conductor 560. Providing the metal oxide that inhibits diffusion of oxygen inhibits diffusion of excess oxygen from the insulator 545 to the conductor 560. That is, a reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Note that the insulator 545 may have a stacked-layer structure like the second gate insulating film. As miniaturization and high integration of transistors progress, a problem such as leakage current might arise because of a thinner gate insulating film. For that reason, when the insulator functioning as the gate insulating film has a stacked-layer structure of a high-k material and a thermally stable material, a gate potential during transistor operation can be reduced while the physical thickness is maintained. Furthermore, the stacked-layer structure can be thermally stable and have a high dielectric constant.

Although the conductor 560 that functions as the first gate electrode and has a two-layer structure is illustrated in FIG. 16A and FIG. 16B, a single-layer structure or a stacked-layer structure of three or more layers may be employed.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 560a has a function of inhibiting diffusion of oxygen, it is possible to inhibit a reduction in conductivity of the conductor 560b due to oxidation caused by oxygen contained in the insulator 545. As a conductive material having a function of inhibiting diffusion of oxygen, for example, tantalum, tantalum nitride, ruthenium, ruthenium oxide, or the like is preferably used. For the conductor 560a, the oxide semiconductor that can be used as the oxide 530 can be used. In that case, when the conductor 560b is deposited by a sputtering method, the conductor 560a can have a reduced electrical resistance value to be a conductor. Such a conductor can be referred to as an OC (Oxide Conductor) electrode.

In addition, a conductive material containing tungsten, copper, or aluminum as its main component is preferably used for the conductor 560b. The conductor 560b also functions as a wiring and thus a conductor having high conductivity is preferably used as the conductor 560b. For example, a conductive material containing tungsten, copper, or aluminum as its main component can be used. The conductor 560b may have a stacked-layer structure, for example, a stacked-layer structure of any of the above conductive materials and titanium or titanium nitride.

The insulator 580 is provided over the conductor 542a and the conductor 542b with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride are preferable because they are thermally stable. In particular, silicon oxide and porous silicon oxide are preferable because an excess-oxygen region can be easily formed in a later step.

The insulator 580 preferably includes an excess-oxygen region. When the insulator 580 that releases oxygen by heating is provided, oxygen in the insulator 580 can be efficiently supplied to the oxide 530. Note that the concentration of impurities such as water and hydrogen in the insulator 580 is preferably reduced.

The opening of the insulator 580 is formed to overlap with the region between the conductor 542a and the conductor 542b. Accordingly, the conductor 560 is formed to be embedded in the opening of the insulator 580 and the region between the conductor 542a and the conductor 542b.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; thus, even when the conductor 560 has a shape with a high aspect ratio, the conductor 560 can be formed without collapsing during the process.

The insulator 574 is preferably provided in contact with a top surface of the insulator 580, a top surface of the conductor 560, and a top surface of the insulator 545. When the insulator 574 is deposited by a sputtering method, excess-oxygen regions can be provided in the insulator 545 and the insulator 580. Accordingly, oxygen can be supplied from the excess-oxygen regions to the oxide 530.

For example, a metal oxide containing one kind or two or more kinds selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

An insulator 581 functioning as an interlayer film is preferably provided over the insulator 574. As in the insulator 524 or the like, the concentration of impurities such as water and hydrogen in the insulator 581 is preferably reduced.

A conductor 540a and a conductor 540b are positioned in openings formed in the insulator 581, the insulator 574, the insulator 580, and the insulator 544. The conductor 540a and the conductor 540b are provided to face each other with the conductor 560 therebetween. The structures of the conductor 540a and the conductor 540b are similar to those of a conductor 546 and a conductor 548 that will be described later.

An insulator 582 is provided over the insulator 581. A substance having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has an excellent blocking effect that prevents the passage of both oxygen and impurities such as hydrogen and moisture which are factors of change in electrical characteristics of the transistor. Accordingly, aluminum oxide can prevent entry of impurities such as hydrogen and moisture into the transistor 500 in the manufacturing process and after the manufacture of the transistor. In addition, release of oxygen from the oxide included in the transistor 500 can be inhibited. Therefore, aluminum oxide is suitably used for the protective film of the transistor 500.

An insulator 586 is provided over the insulator 582. For the insulator 586, a material similar to that for the insulator 320 can be used. When a material with a comparatively low permittivity is used for these insulators, parasitic capacitance generated between wirings can be reduced. A silicon oxide film, a silicon oxynitride film, or the like can be used for the insulator 586, for example.

The conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 550. The conductor 546 and the conductor 548 can be provided using materials similar to those for the conductor 328 and the conductor 330.

After the transistor 500 is formed, an opening may be formed to surround the transistor 500 and an insulator having a high barrier property against hydrogen or water may be formed to cover the opening. Surrounding the transistor 500 with the insulator having a high barrier property can prevent entry of moisture and hydrogen from the outside. Alternatively, a plurality of transistors 500 may be collectively surrounded by the insulator having a high barrier property against hydrogen or water. When an opening is formed to surround the transistor 500, for example, the formation of an opening reaching the insulator 522 or the insulator 514 and the formation of the insulator having a high barrier property in contact with the insulator 522 or the insulator 514 are suitable because these formation steps can also serve as some of the manufacturing steps of the transistor 500. The insulator having a high barrier property against hydrogen or water is formed using a material similar to that for the insulator 522 or the insulator 514, for example.

Next, the capacitor 600 is provided above the transistor 500. The capacitor 600 includes a conductor 610, a conductor 620, and an insulator 630.

A conductor 612 may be provided over the conductor 546 and the conductor 548. The conductor 612 has a function of a plug or a wiring that is connected to the transistor 500. The conductor 610 has a function of an electrode of the capacitor 600. Note that the conductor 612 and the conductor 610 can be formed at the same time.

For the conductor 612 and the conductor 610, a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like can be used. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 each having a single-layer structure are described in this embodiment, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 therebetween. Note that a conductive material such as a metal material, an alloy material, or a metal oxide material can be used for the conductor 620. It is preferable to use a high-melting-point material that has both heat resistance and conductivity, such as tungsten or molybdenum, and it is particularly preferable to use tungsten. In addition, in the case where the conductor 620 is formed concurrently with another component such as a conductor, Cu (copper), Al (aluminum), or the like, which is a low-resistance metal material, is used.

An insulator 640 is provided over the conductor 620 and the insulator 630. The insulator 640 can be provided using a material similar to that for the insulator 320. In addition, the insulator 640 may function as a planarization film that covers an uneven shape therebelow.

With use of this structure, a semiconductor device using a transistor including an oxide semiconductor can be miniaturized or highly integrated.

Examples of a substrate that can be used for the semiconductor device of one embodiment of the present invention include a glass substrate, a quartz substrate, a sapphire substrate, a ceramic substrate, a metal substrate (e.g., a stainless steel substrate, a substrate including stainless steel foil, a tungsten substrate, and a substrate including tungsten foil), a semiconductor substrate (e.g., a single crystal semiconductor substrate, a polycrystalline semiconductor substrate, and a compound semiconductor substrate), and an SOI (Silicon on Insulator) substrate. Alternatively, a plastic substrate having heat resistance to the processing temperature in this embodiment may be used. Examples of a glass substrate include a barium borosilicate glass substrate, an aluminosilicate glass substrate, an aluminoborosilicate glass substrate, and a soda lime glass substrate. Alternatively, crystallized glass or the like can be used.

Alternatively, a flexible substrate, an attachment film, paper including a fibrous material, a base material film, or the like can be used as the substrate. As examples of the flexible substrate, the attachment film, the base material film, and the like, the following can be given. Examples include plastics typified by polyethylene terephthalate (PET), polyethylene naphthalate (PEN), polyether sulfone (PES), and polytetrafluoroethylene (PTFE). Another example is a synthetic resin such as acrylic. Other examples include polypropylene, polyester, polyvinyl fluoride, and polyvinyl chloride. Other examples include polyamide, polyimide, an aramid resin, an epoxy resin, an inorganic vapor deposition film, and paper. In particular, the use of a semiconductor substrate, a single crystal substrate, an SOI substrate, or the like enables the manufacture of small-sized transistors with a small variation in characteristics, size, shape, or the like and with high current capability. When a circuit is formed with such transistors, lower power consumption of the circuit or higher integration of the circuit can be achieved.

A flexible substrate may be used as the substrate, and a transistor, a resistor, a capacitor, and/or the like may be formed directly over the flexible substrate. Alternatively, a separation layer may be provided between the substrate and the transistor, the resistor, the capacitor, and/or the like. After part or the whole of a semiconductor device is completed over the separation layer, the separation layer can be used for separation from the substrate and transfer to another substrate. In such a case, the transistor, the resistor, the capacitor, and/or the like can be transferred to a substrate having low heat resistance or a flexible substrate. As the separation layer, a stack of inorganic films, namely a tungsten film and a silicon oxide film, an organic resin film of polyimide or the like formed over a substrate, or a silicon film containing hydrogen can be used, for example.

That is, a semiconductor device may be formed over one substrate and then transferred to another substrate. Examples of a substrate to which a semiconductor device is transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupro, rayon, or regenerated polyester), or the like), a leather substrate, and a rubber substrate. With use of any of these substrates, a flexible semiconductor device or a highly durable semiconductor device can be manufactured, high heat resistance can be provided, or a reduction in weight or thickness can be achieved.

Providing a semiconductor device over a flexible substrate can suppress an increase in weight and can produce a non-breakable semiconductor device.

Modification Example 1 of Transistor

Figure 17A:
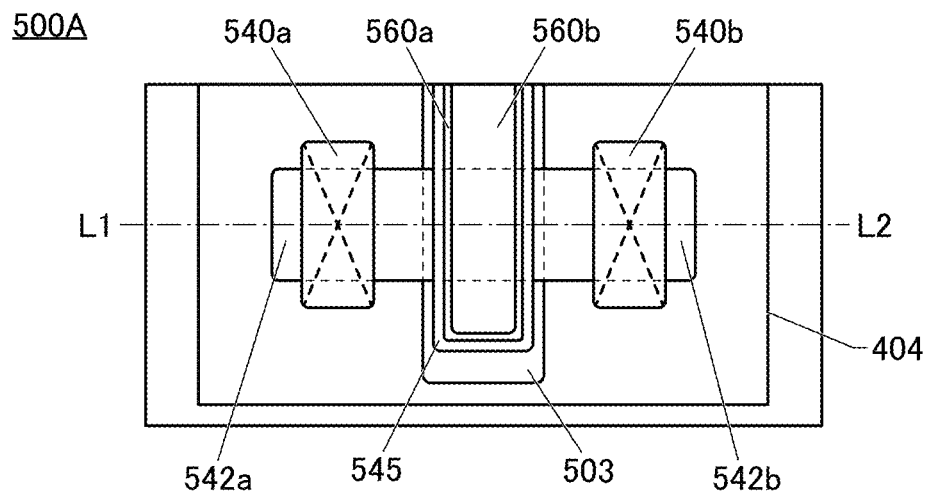
FIG. 17A and FIG. 17B are diagrams illustrating a transistor structure example.
Figure 17B:
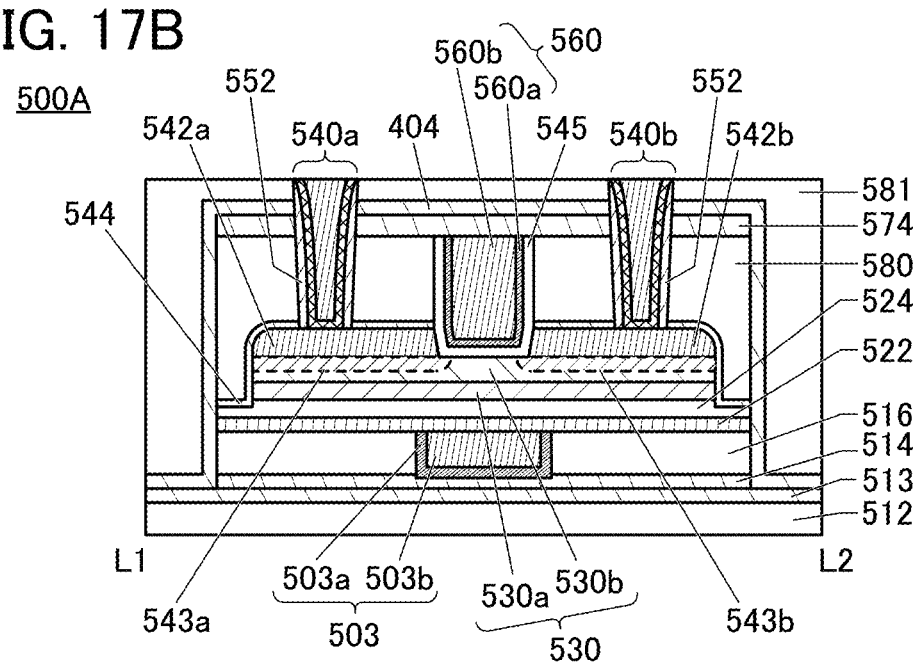

A transistor 500A illustrated in FIG. 17A and FIG. 17B is a modification example of the transistor 500 having the structure illustrated in FIG. 16A and FIG. 16B. FIG. 17A is a top view of the transistor 500A, and FIG. 17B is a cross-sectional view of the transistor 500A in the channel length direction (a cross-sectional view of a portion indicated by the dashed-dotted line L1-L2 in FIG. 17A). Note that the structure illustrated in FIG. 17A and FIG. 17B can also be employed for other transistors, such as the transistor 550, included in the semiconductor device of one embodiment of the present invention.

The transistor 500A having the structure illustrated in FIG. 17A and FIG. 17B is different from the transistor 500 having the structure illustrated in FIG. 16A and FIG. 16B in that an insulator 552, an insulator 513, and an insulator 404 are included. Furthermore, the transistor 500A is different from the transistor 500 having the structure illustrated in FIG. 16A and FIG. 16B in that the insulator 552 is provided in contact with a side surface of the conductor 540a and a side surface of the conductor 540b. Moreover, the transistor 500A is different from the transistor 500 having the structure illustrated in FIG. 16A and FIG. 16B in that the insulator 520 is not included.

In the transistor 500 having the structure illustrated in FIG. 17A and FIG. 17B, the insulator 513 is provided over the insulator 512. The insulator 404 is provided over the insulator 574 and the insulator 513.

In the transistor 500 having the structure illustrated in FIG. 17A and FIG. 17B, the insulator 514, the insulator 516, the insulator 522, the insulator 524, the insulator 544, the insulator 580, and the insulator 574 are patterned and covered with the insulator 404. That is, the insulator 404 is in contact with a top surface of the insulator 574, a side surface of the insulator 574, a side surface of the insulator 580, a side surface of the insulator 544, a side surface of the insulator 524, a side surface of the insulator 522, a side surface of the insulator 516, a side surface of the insulator 514, and a top surface of the insulator 513. Thus, the oxide 530 and the like are isolated from the outside by the insulator 404 and the insulator 513.

The insulator 513 and the insulator 404 preferably have high capability of inhibiting diffusion of hydrogen (e.g., at least one of a hydrogen atom, a hydrogen molecule, and the like) or a water molecule. For example, for the insulator 513 and the insulator 404, silicon nitride or silicon nitride oxide that is a material having a high hydrogen barrier property is preferably used. This can inhibit diffusion of hydrogen or the like into the oxide 530, thereby suppressing the degradation of the characteristics of the transistor 500A. Consequently, the reliability of the semiconductor device of one embodiment of the present invention can be increased.

The insulator 552 is provided in contact with the insulator 581, the insulator 404, the insulator 574, the insulator 580, and the insulator 544. The insulator 552 preferably has a function of inhibiting diffusion of hydrogen or water molecules. For example, for the insulator 552, an insulator such as silicon nitride, aluminum oxide, or silicon nitride oxide that is a material having a high hydrogen barrier property is preferably used. In particular, it is preferable to use silicon nitride as the insulator 552 because of its high hydrogen barrier property. The use of a material having a high hydrogen barrier property for the insulator 552 can inhibit diffusion of impurities such as water and hydrogen from the insulator 580 and the like into the oxide 530 through the conductor 540a and the conductor 540b. Furthermore, oxygen contained in the insulator 580 can be inhibited from being absorbed by the conductor 540a and the conductor 540b.

As described above, the reliability of the semiconductor device of one embodiment of the present invention can be increased.

Modification Example 2 of Transistor

Figure 18A:
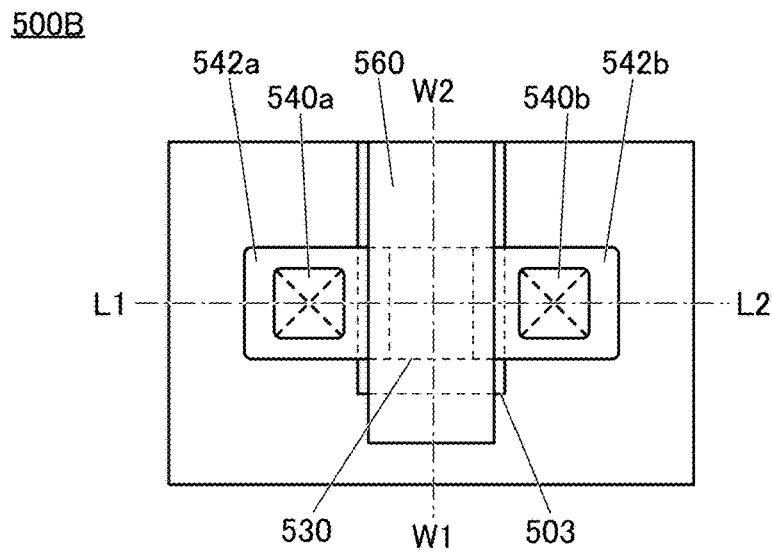
FIG. 18A to FIG. 18C are diagrams illustrating a transistor structure example.
Figure 18B:
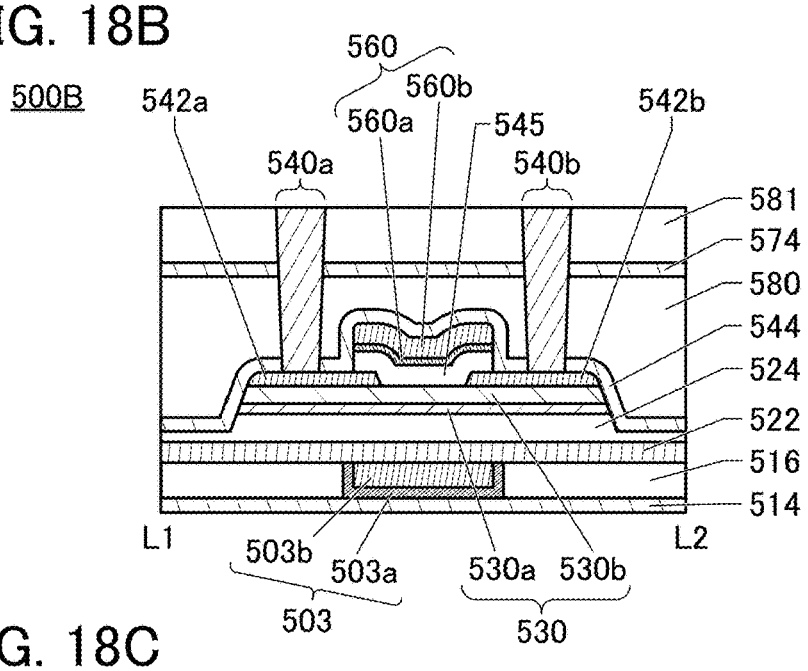
Figure 18C:
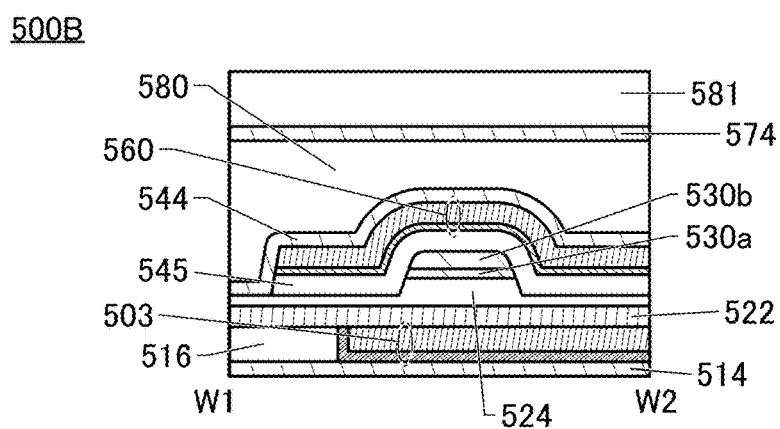

A structure example of a transistor 500B is described with reference to FIG. 18A, FIG. 18B, and FIG. 18C. FIG. 18A is a top view of the transistor 500B. FIG. 18B is a cross-sectional view of a portion indicated by the dashed-dotted line L1-L2 in FIG. 18A. FIG. 18C is a cross-sectional view of a portion indicated by the dashed-dotted line W1-W2 in FIG. 18A. Note that for clarity of the drawing, some components are not illustrated in the top view of FIG. 18A.

The transistor 500B is a modification example of the transistor 500 and can be replaced with the transistor 500. Thus, differences of the transistor 500B from the transistor 500 will be mainly described to avoid repeated description.

The conductor 560 functioning as a first gate electrode includes the conductor 560a and the conductor 560b over the conductor 560a. For the conductor 560a, a conductive material that has a function of inhibiting diffusion of impurities such as a hydrogen atom, a hydrogen molecule, a water molecule, and a copper atom is preferably used. Alternatively, it is preferable to use a conductive material having a function of inhibiting diffusion of oxygen (e.g., at least one of an oxygen atom, an oxygen molecule, and the like).

When the conductor 560a has a function of inhibiting oxygen diffusion, the range of choices for the material of the conductor 560b can be extended. That is, the conductor 560a inhibits oxidation of the conductor 560b, thereby preventing the decrease in conductivity.

The insulator 544 is preferably provided to cover the top surface and the side surface of the conductor 560 and a side surface of the insulator 545. For the insulator 544, an insulating material having a function of inhibiting diffusion of oxygen and impurities such as water and hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide; silicon nitride oxide; silicon nitride; or the like.

The insulator 544 can inhibit oxidation of the conductor 560. Moreover, the insulator 544 can inhibit diffusion of impurities such as water and hydrogen contained in the insulator 580 into the transistor 500B.

The transistor 500B has the conductor 560 overlapping with part of the conductor 542a and part of the conductor 542b, and thus tends to have larger parasitic capacitance than the transistor 500. Consequently, the transistor 500B tends to have a lower operating frequency than the transistor 500. However, the transistor 500B does not require steps of providing an opening in the insulator 580 and the like and embedding the conductor 560, the insulator 545, and the like in the opening; hence, the productivity of the transistor 500B is higher than that of the transistor 500.

The composition, structure, method, and the like described in this embodiment can be used in combination as appropriate with the compositions, structures, methods, and the like described in the other embodiments, the example, and the like.

Embodiment 5

In this embodiment, an oxide semiconductor that is a kind of metal oxide will be described.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structure>

First, the classification of the crystal structures of an oxide semiconductor will be described with reference to FIG. 19A. FIG. 19A is a diagram showing the classification of crystal structures of an oxide semiconductor, typically IGZO (a metal oxide containing In, Ga, and Zn).

As shown in FIG. 19A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite). Note that the term "Crystalline" excludes single crystal, poly crystal, and completely amorphous. The term "Crystal" includes single crystal and poly crystal.

Note that the structures in the thick frame in FIG. 19A are in an intermediate state between "Amorphous" and "Crystal", and belong to a new crystalline phase. That is, these structures are completely different from "Amorphous", which is energetically unstable, and "Crystal".

A crystal structure of a film or a substrate can be evaluated with an X-ray diffraction (XRD) spectrum. FIG. 19B shows an XRD spectrum, which is obtained by GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 19B and obtained by GIXD measurement is hereinafter simply referred to as an XRD spectrum. The CAAC-IGZO film in FIG. 19B has a composition in the vicinity of In:Ga:Zn=4:2:3 [atomic ratio]. The CAAC-IGZO film in FIG. 19B has a thickness of 500 nm.

As shown in FIG. 19B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 19B, the peak at 2θ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 19C shows a diffraction pattern of the CAAC-IGZO film. FIG. 19C shows a diffraction pattern obtained with the NBED method in which an electron beam is incident in the direction parallel to the substrate. The composition of the CAAC-IGZO film in FIG. 19C is In:Ga:Zn=4:2:3 [atomic ratio] or the neighborhood thereof. In the nanobeam electron diffraction method, electron diffraction is performed with a probe diameter of 1 nm.

As shown in FIG. 19C, a plurality of spots indicating c-axis alignment are observed in the diffraction pattern of the CAAC-IGZO film.

<<Structure of Oxide Semiconductor>>

Oxide semiconductors might be classified in a manner different from that in FIG. 19A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS will be described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using $\theta/2\theta$ scanning, for example, a peak indicating c-axis alignment is detected at $2\theta$ of 31° or around 31°. Note that the position of the peak indicating c-axis alignment (the value of $2\theta$) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear crystal grain boundary is observed is what is called polycrystal. It is highly probable that the crystal grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by out-of-plane XRD measurement with an XRD apparatus using $\theta/2\theta$ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[a-Like OS]

The a-like OS is an oxide semiconductor having a structure between those of the nc-OS and the amorphous oxide semiconductor. The a-like OS includes a void or a low-density region. That is, the a-like OS has low crystallinity as compared with the nc-OS and the CAAC-OS. Moreover, the a-like OS has higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, in EDX mapping obtained by energy dispersive X-ray spectroscopy (EDX), it is confirmed that the CAC-OS in the In—Ga—Zn oxide has a composition in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. A CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility ($\mu$), and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for the transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

The composition, structure, method, and the like described in this embodiment can be used in combination as appropriate with the compositions, structures, methods, and the like described in the other embodiments, the example, and the like.

Embodiment 6

In this embodiment, application examples of the above-described semiconductor device will be described.

[Semiconductor Wafer and Chip]

Figure 20A:
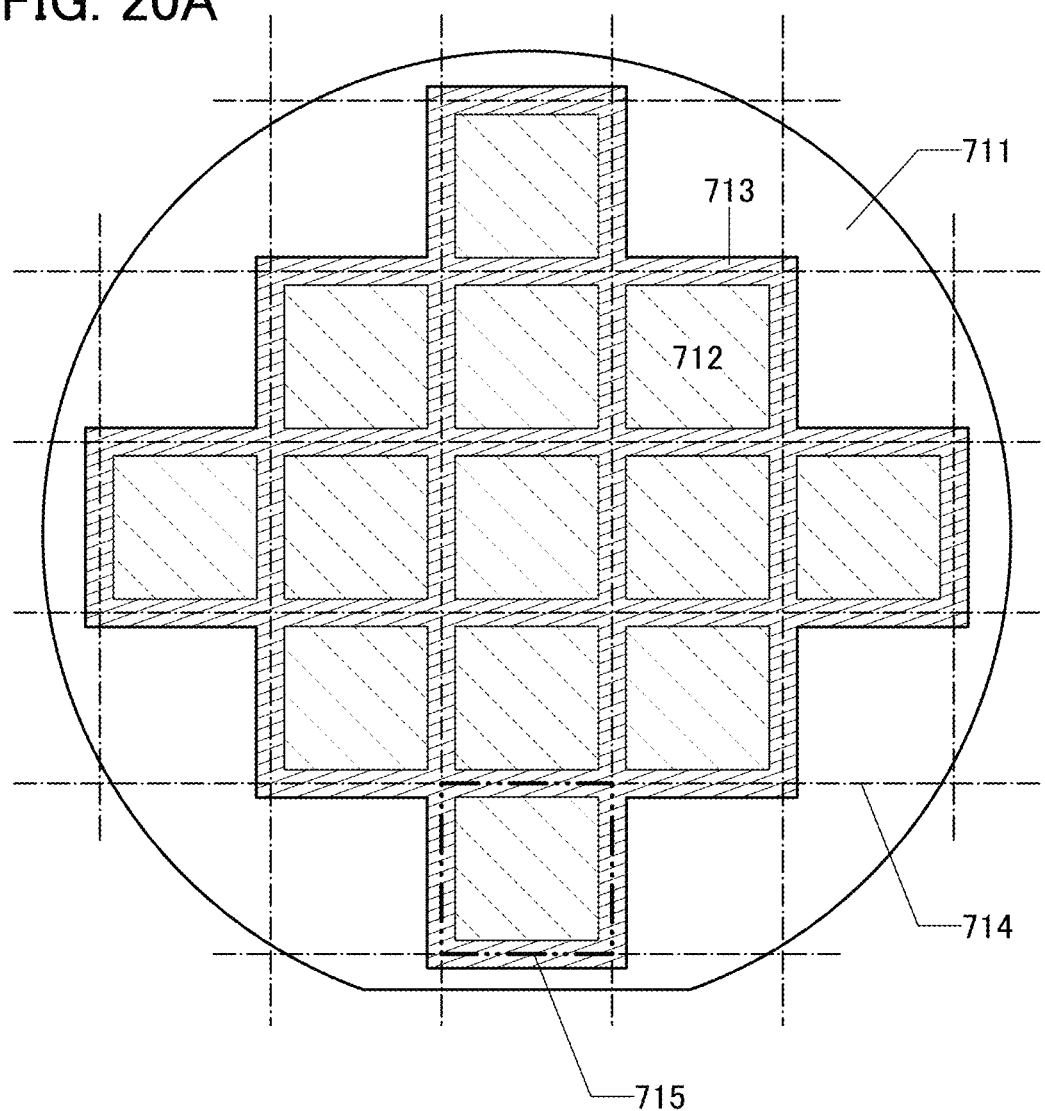
FIG. 20A is a top view of a semiconductor wafer.

FIG. 20A is a top view of a substrate 711 before dicing treatment. As the substrate 711, a semiconductor substrate (also referred to as a "semiconductor wafer") can be used, for example. A plurality of circuit regions 712 are provided over the substrate 711. A semiconductor device of one embodiment of the present invention, a CPU, an RF tag, an image sensor, or the like can be provided in the circuit region 712.

Figure 20B:
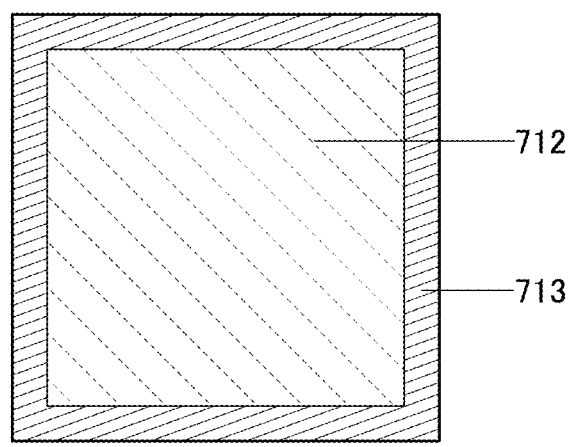
FIG. 20B is an enlarged view of a chip.

The plurality of circuit regions 712 are each surrounded by a separation region 713. Separation lines (also referred to as "dicing lines") 714 are set at a position overlapping with the separation regions 713. Chips 715 each including the circuit region 712 can be cut from the substrate 711 by cutting the substrate 711 along the separation lines 714. FIG. 20B is an enlarged view of the chip 715.

A conductive layer or a semiconductor layer may be provided in the separation regions 713. Providing a conductive layer or a semiconductor layer in the separation regions 713 relieves ESD that might be caused in a dicing step, preventing a decrease in the yield in the dicing step. A dicing step is generally performed while letting pure water whose specific resistance is decreased by dissolution of a carbonic acid gas or the like flow to a cut portion, in order to cool down a substrate, remove swarf, and prevent electrification, for example. Providing a conductive layer or a semiconductor layer in the separation regions 713 allows a reduction in the usage of the pure water. Therefore, the cost of manufacturing the semiconductor device can be reduced. Moreover, the semiconductor device can be manufactured with improved productivity.

For a semiconductor layer provided in the separation regions 713, a material having a band gap of 2.5 eV or more and 4.2 eV or less, preferably 2.7 eV or more and 3.5 eV or less is preferably used. The use of such a material allows accumulated electric charge to be released slowly; thus, the rapid move of electric charge due to ESD can be inhibited and electrostatic breakdown is less likely to occur.

[Electronic Component]

FIG. 21 shows an example in which the chip 715 is used for an electronic component. Note that an electronic component is also referred to as a semiconductor package or an IC package. For electronic components, there are various standards and names corresponding to a terminal extraction direction and a terminal shape.

An electronic component is completed by combining the semiconductor device described in any of the above embodiments and components other than the semiconductor device in an assembly process (post-process).

Figure 21A:
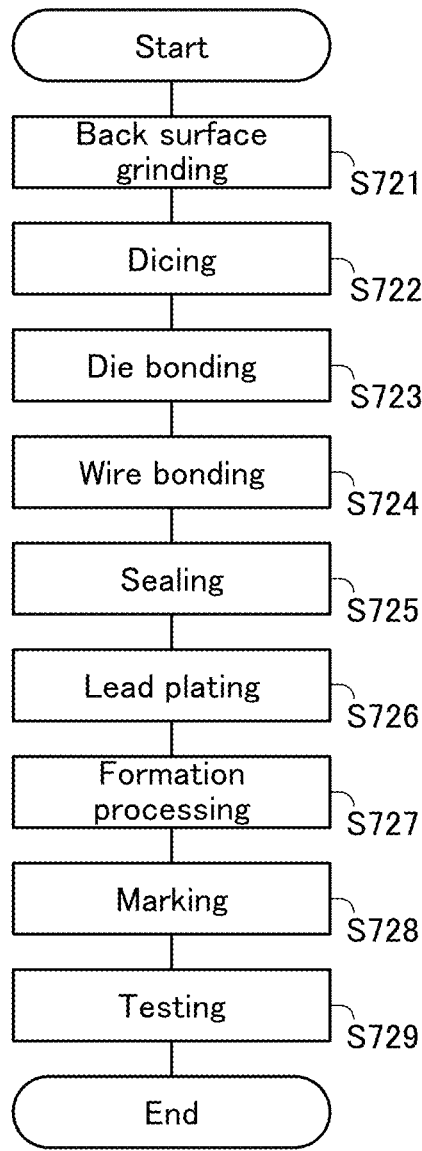
FIG. 21A is a flowchart showing an example of a manufacturing process of an electronic component.

The post-process is described with reference to a flowchart shown in FIG. 21A. After an element substrate including the semiconductor device described in any of the above embodiments is completed in a pre-process, a "back surface grinding step" is performed to grind a back surface (a surface where the semiconductor device and the like are not formed) of the element substrate (Step S721). When the element substrate is thinned by grinding, warpage or the like of the element substrate is reduced, resulting in the reduction in size of the electronic component.

Next, a "dicing step" is performed to divide the element substrate into a plurality of chips (the chips 715) (Step S722). Then, a "die bonding step" is performed to pick up the divided chips separately and bond them onto a lead frame (Step S723). To bond a chip and a lead frame in the die bonding step, resin bonding, tape-automated bonding, or the like is selected as appropriate depending on products. Note that the chip may be bonded to an interposer substrate instead of the lead frame.

Next, a "wire bonding step" is performed to electrically connect a lead of the lead frame and an electrode on the chip through a metal fine line (wire) (Step S724). A silver line or a gold line can be used as the metal fine line. Furthermore, ball bonding or wedge bonding can be used as the wire bonding.

The wire-bonded chip is subjected to a "sealing step (molding step)" of sealing the chip with an epoxy resin or the like (Step S725). Through the sealing step, the inside of the electronic component is filled with a resin, so that a circuit portion incorporated in the chip and a wire for connecting the chip to the lead can be protected from external mechanical force, and deterioration of characteristics (decrease in reliability) due to moisture or dust can be reduced.

Subsequently, a "lead plating step" is performed to plate the lead of the lead frame (Step S726). With the plating process, rust of the lead can be prevented, and soldering for mounting the electronic component on a printed circuit board in a later step can be performed more surely. Then, a "formation step" is performed to cut and process the lead (Step S727).

Next, a "marking step" in which printing (marking) is performed on a surface of the package is conducted (Step S728). After a "testing step" (Step S729) for checking whether an external shape is good and whether there is a malfunction, for example, the electronic component is completed (Step S729).

Figure 21B:
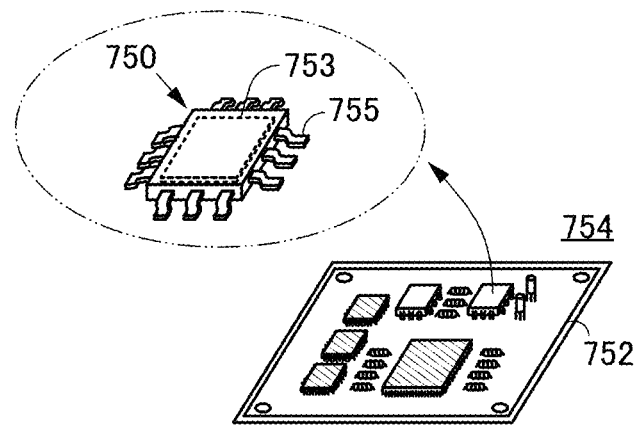
FIG. 21B is a schematic perspective view of an electronic component.

FIG. 21B is a schematic perspective view of the completed electronic component. FIG. 21B is a schematic perspective view of a QFP (Quad Flat Package) as an example of the electronic component. An electronic component 750 illustrated in FIG. 21B includes a lead 755 and a semiconductor device 753. As the semiconductor device 753, the semiconductor device described in any of the above embodiments can be used, for instance.

The electronic component 750 illustrated in FIG. 21B is, for example, mounted on a printed circuit board 752. A plurality of such electronic components 750 are combined and electrically connected to each other on the printed circuit board 752; thus, a board on which the electronic components are mounted (a circuit board 754) is completed. The completed circuit board 754 is used for an electronic device or the like.

[Electronic Device]

Next, examples of electronic devices each including the semiconductor device of one embodiment of the present invention or the above-described electronic component will be described with reference to FIG. 22.

Examples of electronic devices including the semiconductor device of one embodiment of the present invention or the electronic component include display devices of televisions, monitors, and the like, lighting devices, desktop or laptop personal computers, word processors, image reproduction devices which reproduce still images or moving images stored in recording media such as DVDs (Digital Versatile Discs), portable CD players, radios, tape recorders, headphone stereos, stereos, table clocks, wall clocks, cordless phone handsets, transceivers, cellular phones, car phones, portable game machines, tablet terminals, large game machines such as pachinko machines, calculators, portable information terminals (also referred to as "mobile information terminals"), electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, tools such as chain saws, smoke detectors, and medical equipment such as dialyzers. Other examples include industrial equipment such as guide lights, traffic lights, conveyor belts, elevators, escalators, industrial robots, power storage systems, and power storage devices for leveling power supply and smart grid.

In addition, moving objects and the like driven by electric motors using power from power storage devices are also included in the category of electronic devices. Examples of the moving objects include electric vehicles (EVs), hybrid electric vehicles (HEVs) that include both an internal-combustion engine and a motor, plug-in hybrid electric vehicles (PHEVs), tracked vehicles in which caterpillar tracks are substituted for wheels of these vehicles, motorized bicycles including motor-assisted bicycles, motorcycles, electric wheelchairs, golf carts, boats or ships, submarines, helicopters, aircraft, rockets, artificial satellites, space probes, planetary probes, and spacecraft.

The semiconductor device of one embodiment of the present invention or the electronic component can be used for communication devices in any of the electronic devices.

The electronic device may include a sensor (a sensor having a function of measuring force, displacement, position, speed, acceleration, angular velocity, rotational frequency, distance, light, liquid, magnetism, temperature, a chemical substance, sound, time, hardness, an electric field, current, voltage, power, radiation, flow rate, humidity, gradient, oscillation, a smell, or infrared rays) and the like.

The electronic device can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 22:
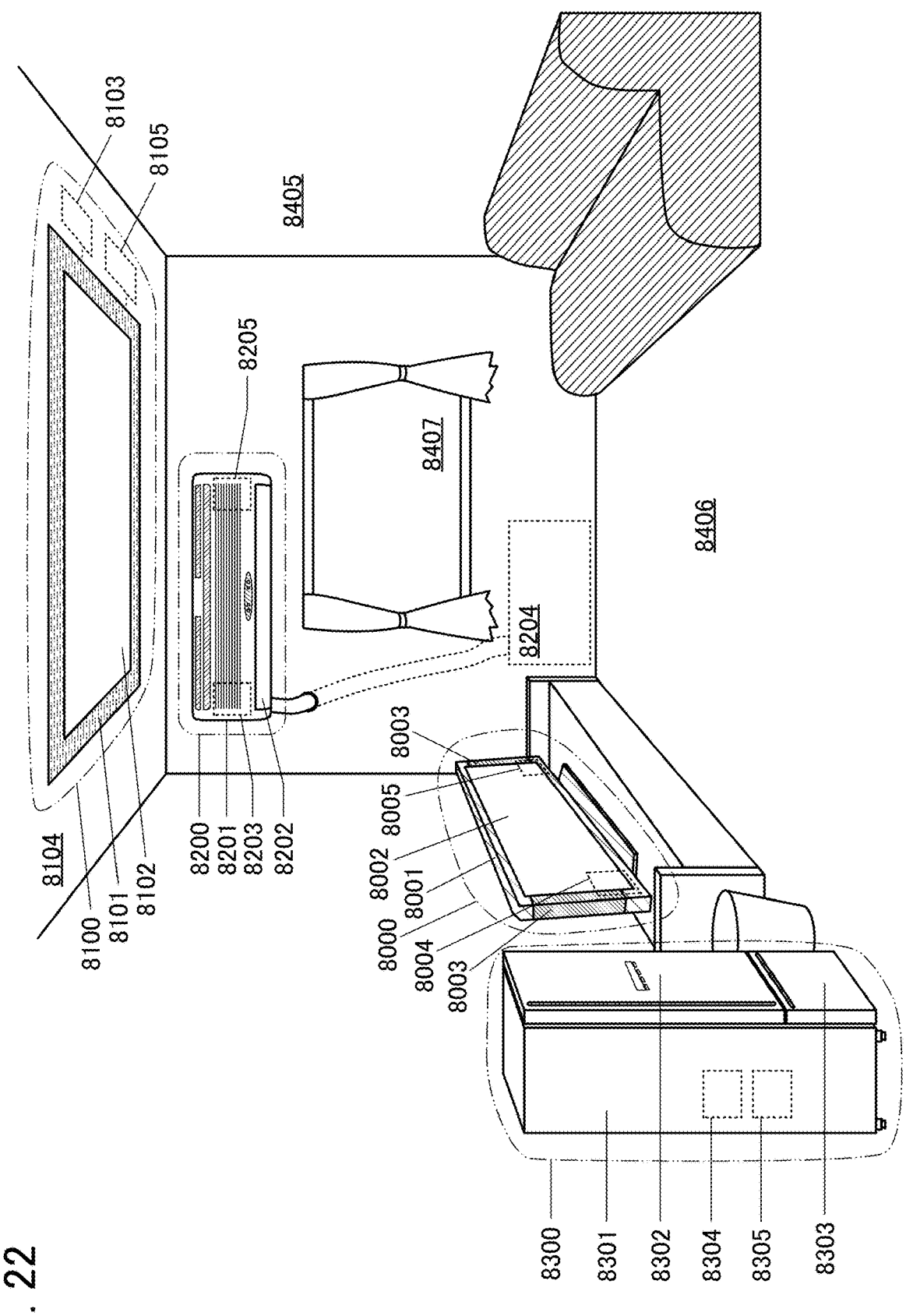
FIG. 22 is a diagram illustrating examples of electronic devices.

FIG. 22 and FIG. 23A to FIG. 23F illustrate examples of electronic devices. In FIG. 22, a display device 8000 is an example of an electronic device including a semiconductor device 8004 of one embodiment of the present invention. Specifically, the display device 8000 corresponds to a display device for TV broadcast reception and includes a housing 8001, a display portion 8002, speaker portions 8003, the semiconductor device 8004, a power storage device 8005, and the like. The semiconductor device 8004 of one embodiment of the present invention is provided in the housing 8001. The semiconductor device 8004 can hold control data, a control program, or the like. The semiconductor device 8004 has a communication function, and the display device 8000 can function as an IoT device. The display device 8000 can receive power from a commercial power supply. Alternatively, the display device 8000 can use power stored in the power storage device 8005.

The display portion 8002 can include a display device such as a liquid crystal display device, a light-emitting display device in which a light-emitting element, e.g., an organic EL element, is provided in each pixel, an electrophoretic display device, a DMD (Digital Micromirror Device), a PDP (Plasma Display Panel), or an FED (Field Emission Display).

Note that the display device includes, in its category, all of information display devices for personal computers, advertisement display, and the like besides for TV broadcast reception.

In FIG. 22, an installation lighting device 8100 is an example of an electronic device including a semiconductor device 8103 of one embodiment of the present invention. Specifically, the lighting device 8100 includes a housing 8101, a light source 8102, the semiconductor device 8103, a power storage device 8105, and the like. Although FIG. 22 illustrates an example of the case where the semiconductor device 8103 is provided in a ceiling 8104 on which the housing 8101 and the light source 8102 are installed, the semiconductor device 8103 may be provided in the housing 8101. The semiconductor device 8103 can hold data such as emission luminance of the light source 8102, a control program, or the like. The semiconductor device 8103 has a communication function, and the lighting device 8100 can function as an IoT device. The lighting device 8100 can receive power from a commercial power supply. Alternatively, the lighting device 8100 can use power stored in the power storage device.

Note that although FIG. 22 illustrates the installation lighting device 8100 provided in the ceiling 8104 as an example, the semiconductor device of one embodiment of the present invention can be used in an installation lighting device provided in, for example, a wall 8405, a floor 8406, a window 8407, or the like other than the ceiling 8104. Alternatively, the semiconductor device of one embodiment of the present invention can be used in a tabletop lighting device or the like.

As the light source 8102, an artificial light source that emits light artificially by using power can be used. Specific examples of the artificial light source include an incandescent lamp, a discharge lamp such as a fluorescent lamp, and light-emitting elements such as an LED and an organic EL element.

In FIG. 22, an air conditioner including an indoor unit 8200 and an outdoor unit 8204 is an example of an electronic device including a semiconductor device 8203 of one embodiment of the present invention. Specifically, the indoor unit 8200 includes a housing 8201, an air outlet 8202, the semiconductor device 8203, a power storage device 8205, and the like. Although FIG. 22 illustrates an example of the case where the semiconductor device 8203 is provided in the indoor unit 8200, the semiconductor device 8203 may be provided in the outdoor unit 8204. Alternatively, the semiconductor devices 8203 may be provided in both the indoor unit 8200 and the outdoor unit 8204. The semiconductor device 8203 can hold control data, a control program, or the like of the air conditioner. The semiconductor device 8203 has a communication function, and the air conditioner can function as an IoT device. The air conditioner can receive power from a commercial power supply. Alternatively, the air conditioner can use power stored in the power storage device 8205.

Note that although FIG. 22 illustrates the split-type air conditioner including the indoor unit and the outdoor unit as an example, the semiconductor device of one embodiment of the present invention can be used in an air conditioner in which the functions of an indoor unit and an outdoor unit are integrated in one housing.

In FIG. 22, an electric refrigerator-freezer 8300 is an example of an electronic device including a semiconductor device 8304 of one embodiment of the present invention. Specifically, the electric refrigerator-freezer 8300 includes a housing 8301, a refrigerator door 8302, a freezer door 8303, the semiconductor device 8304, a power storage device 8305, and the like. The power storage device 8305 is provided in the housing 8301 in FIG. 22. The semiconductor device 8304 can hold control data, a control program, or the like of the electric refrigerator-freezer 8300. The semiconductor device 8304 has a communication function, and the electric refrigerator-freezer 8300 can function as an IoT device. The electric refrigerator-freezer 8300 can receive power from a commercial power supply. Alternatively, the electric refrigerator-freezer 8300 can use power stored in the power storage device 8305.

Figure 23A:
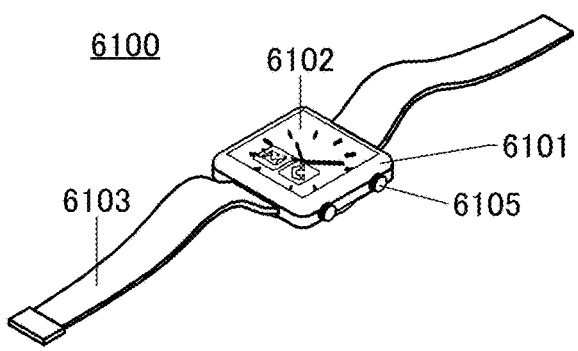
FIG. 23A to FIG. 23F are diagrams illustrating examples of electronic devices.

FIG. 23A illustrates an example of a wrist-watch-type mobile information terminal. A mobile information terminal 6100 includes a housing 6101, a display portion 6102, a band 6103, operation buttons 6105, and the like. The mobile information terminal 6100 further includes a secondary battery and the semiconductor device of one embodiment of the present invention or the electronic component. The mobile information terminal 6100 including the semiconductor device of one embodiment of the present invention or the electronic component can function as an IoT device.

Figure 23B:
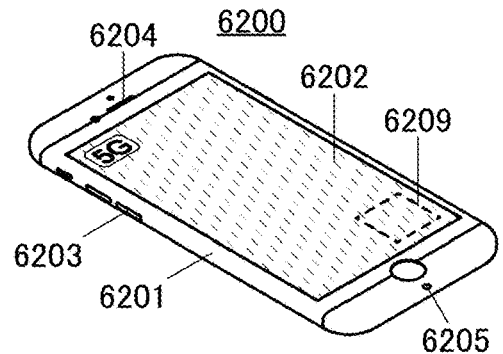

FIG. 23B illustrates an example of a cellular phone. A mobile information terminal 6200 includes a display portion 6202 incorporated in a housing 6201, operation buttons 6203, a speaker 6204, a microphone 6205, and the like.

The mobile information terminal 6200 further includes a fingerprint sensor 6209 in a region overlapping with the display portion 6202. The fingerprint sensor 6209 may be an organic optical sensor. Since a fingerprint differs between individuals, the fingerprint sensor 6209 can perform personal authentication when acquiring fingerprint patterns. As a light source for acquiring fingerprint patterns with the fingerprint sensor 6209, light emitted from the display portion 6202 can be used.

The mobile information terminal 6200 further includes a secondary battery and the semiconductor device of one embodiment of the present invention or the electronic component. The mobile information terminal 6200 including the semiconductor device of one embodiment of the present invention or the electronic component can function as an IoT device.

Figure 23C:
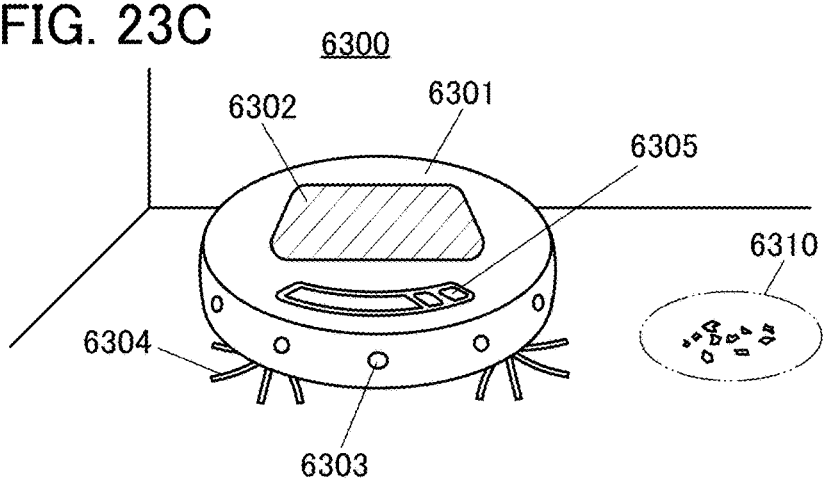

FIG. 23C illustrates an example of a cleaning robot. A cleaning robot 6300 includes a display portion 6302 placed on the top surface of a housing 6301, a plurality of cameras 6303 placed on the side surface of the housing 6301, a brush 6304, operation buttons 6305, a variety of sensors, and the like. Although not illustrated, the cleaning robot 6300 is provided with a tire, an inlet, and the like. The cleaning robot 6300 can run autonomously, detect dust 6310, and vacuum the dust through the inlet provided on a bottom surface.

For example, the cleaning robot 6300 can analyze images taken by the cameras 6303 to judge whether there are obstacles such as a wall, furniture, or a step. When an object that is likely to be caught in the brush 6304, such as a wire, is detected by image analysis, the rotation of the brush 6304 can be stopped. The cleaning robot 6300 includes a secondary battery and the semiconductor device of one embodiment of the present invention or the electronic component. The cleaning robot 6300 including the semiconductor device of one embodiment of the present invention or the electronic component can function as an IoT device.

Figure 23D:
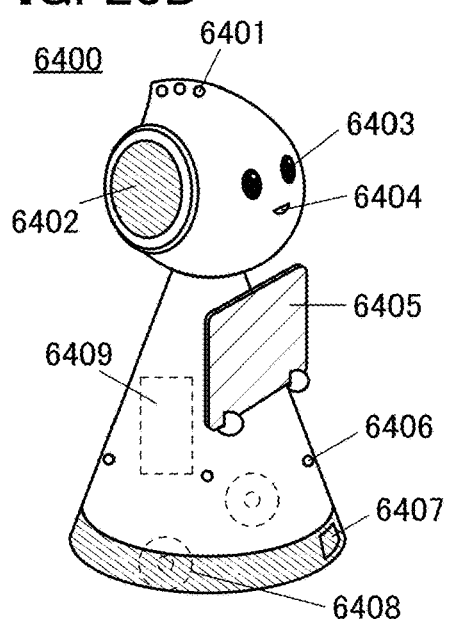

FIG. 23D illustrates an example of a robot. A robot 6400 illustrated in FIG. 23D includes an arithmetic device 6409, an illuminance sensor 6401, a microphone 6402, an upper camera 6403, a speaker 6404, a display portion 6405, a lower camera 6406, an obstacle sensor 6407, and a moving mechanism 6408.

The microphone 6402 has a function of detecting a speaking voice of a user, an environmental sound, and the like. The speaker 6404 has a function of outputting sound. The robot 6400 can communicate with a user with the use of the microphone 6402 and the speaker 6404.

The display portion 6405 has a function of displaying various kinds of information. The robot 6400 can display user's desired information on the display portion 6405. A touch panel may be incorporated in the display portion 6405. Moreover, the display portion 6405 may be a detachable information terminal, in which case charging and data communication can be performed when the display portion 6405 is set at the home position of the robot 6400.

The upper camera 6403 and the lower camera 6406 each have a function of taking an image of the surroundings of the robot 6400. The obstacle sensor 6407 can detect an obstacle in the direction where the robot 6400 advances with the moving mechanism 6408. The robot 6400 can move safely by recognizing the surroundings with the upper camera 6403, the lower camera 6406, and the obstacle sensor 6407. The light-emitting device of one embodiment of the present invention can be used for the display portion 6405.

The robot 6400 includes a secondary battery and the semiconductor device of one embodiment of the present invention or the electronic component. The robot 6400 including the semiconductor device of one embodiment of the present invention or the electronic component can function as an IoT device.

Figure 23E:
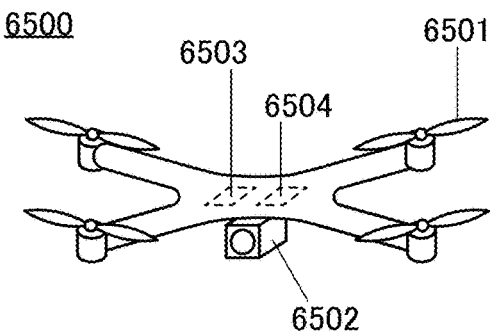

FIG. 23E illustrates an example of a flying object. A flying object 6500 illustrated in FIG. 23E includes propellers 6501, a camera 6502, a battery 6503, and the like and has a function of flying autonomously.

For example, image data taken by the camera 6502 is stored in an electronic component 6504. The electronic component 6504 can analyze the image data to detect whether there are obstacles when the flying object moves. Moreover, the electronic component 6504 can estimate the remaining battery level from a change in the power storage capacity of the battery 6503. The flying object 6500 includes the semiconductor device of one embodiment of the present invention or the electronic component. The flying object 6500 including the semiconductor device of one embodiment of the present invention or the electronic component can function as an IoT device.

Figure 23F:
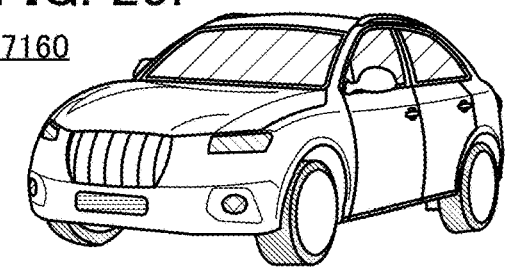

FIG. 23F illustrates an example of an automobile. An automobile 7160 includes an engine, tires, a brake, a steering gear, a camera, and the like. The automobile 7160 includes the semiconductor device of one embodiment of the present invention or the electronic component. The automobile 7160 including the semiconductor device of one embodiment of the present invention or the electronic component can function as an IoT device.

The composition, structure, method, and the like described in this example can be used in combination as appropriate with the compositions, structures, methods, and the like described in the other embodiments, the example, and the like.

Embodiment 7

The use of the OS transistor described in this specification and the like enables a normally-off CPU (also referred to as "Noff CPU") to be obtained. Note that the Noff CPU is an integrated circuit including a normally-off transistor, which is in a non-conduction state (also referred to as off state) even when a gate voltage is 0 V.

In the Noff CPU, power supply to a circuit that does not need to operate can be stopped so that the circuit can be brought into a standby state. The circuit brought into the standby state because of the stop of power supply does not consume power. Thus, the power usage of the Noff CPU can be minimized. Moreover, the Noff CPU can hold data necessary for operation, such as setting conditions, for a long time even when power supply is stopped. The return from the standby state requires only restart of power supply to the circuit and does not require rewriting of setting conditions or the like. In other words, high-speed return from the standby state is possible. As described here, the power consumption of the Noff CPU can be reduced without a significant decrease in operation speed.

The Noff CPU can be suitably used for a small-scale system such as an IoT (Internet of Things) end device (also referred to as endpoint microcomputer) 803 in the IoT field, for example.

Figure 24:
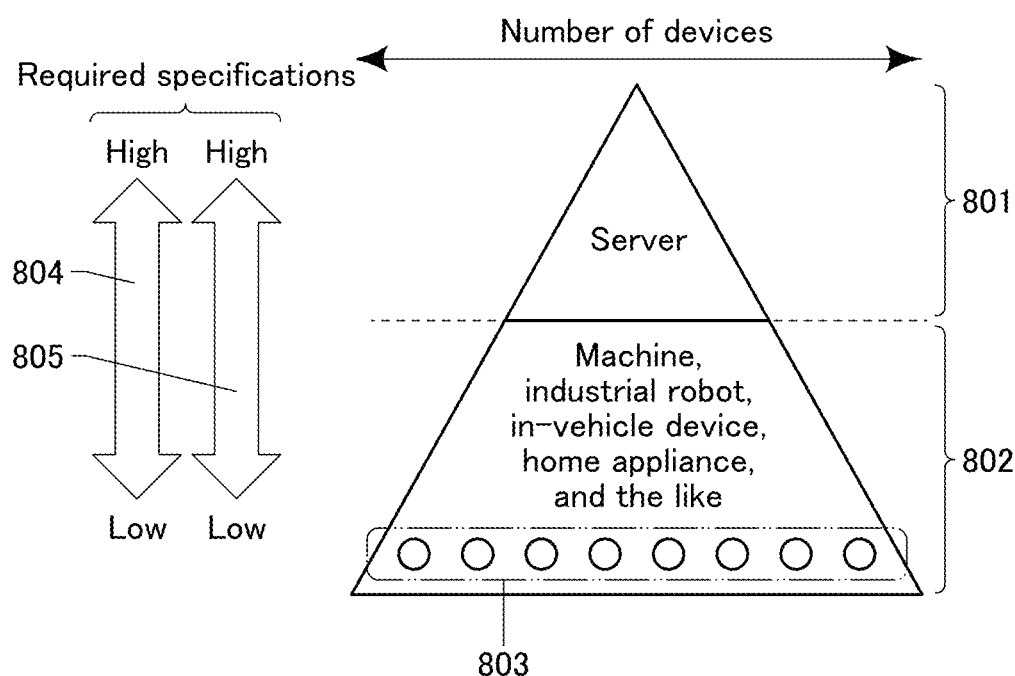
FIG. 24 is a diagram illustrating a hierarchical structure of an IoT network and tendencies of required specifications.

FIG. 24 shows a hierarchical structure of an IoT network and tendencies of required specifications. FIG. 24 shows power consumption 804 and processing performance 805 as the required specifications. The hierarchical structure of the IoT network is roughly divided into a cloud field 801 at the upper level and an embedded field 802 at the lower level. The cloud field 801 includes a server, for example. The embedded field 802 includes a machine, an industrial robot, an in-vehicle device, and a home appliance, for example.

At the upper level, higher processing performance is required rather than lower power consumption. Thus, a high-performance CPU, a high-performance GPU, a large-scale SoC (System on a Chip), and the like are used in the cloud field 801. Furthermore, at the lower level, lower power consumption is required rather than higher processing performance, and the number of devices is explosively increased. The semiconductor device of one embodiment of the present invention can be suitably used for a communication device in the IoT end device that needs to have low power consumption.

Note that an "endpoint" refers to an end region of the embedded field 802. Examples of a device used in the endpoint include microcomputers used in a factory, a home appliance, infrastructure, agriculture, and the like.

Figure 25:
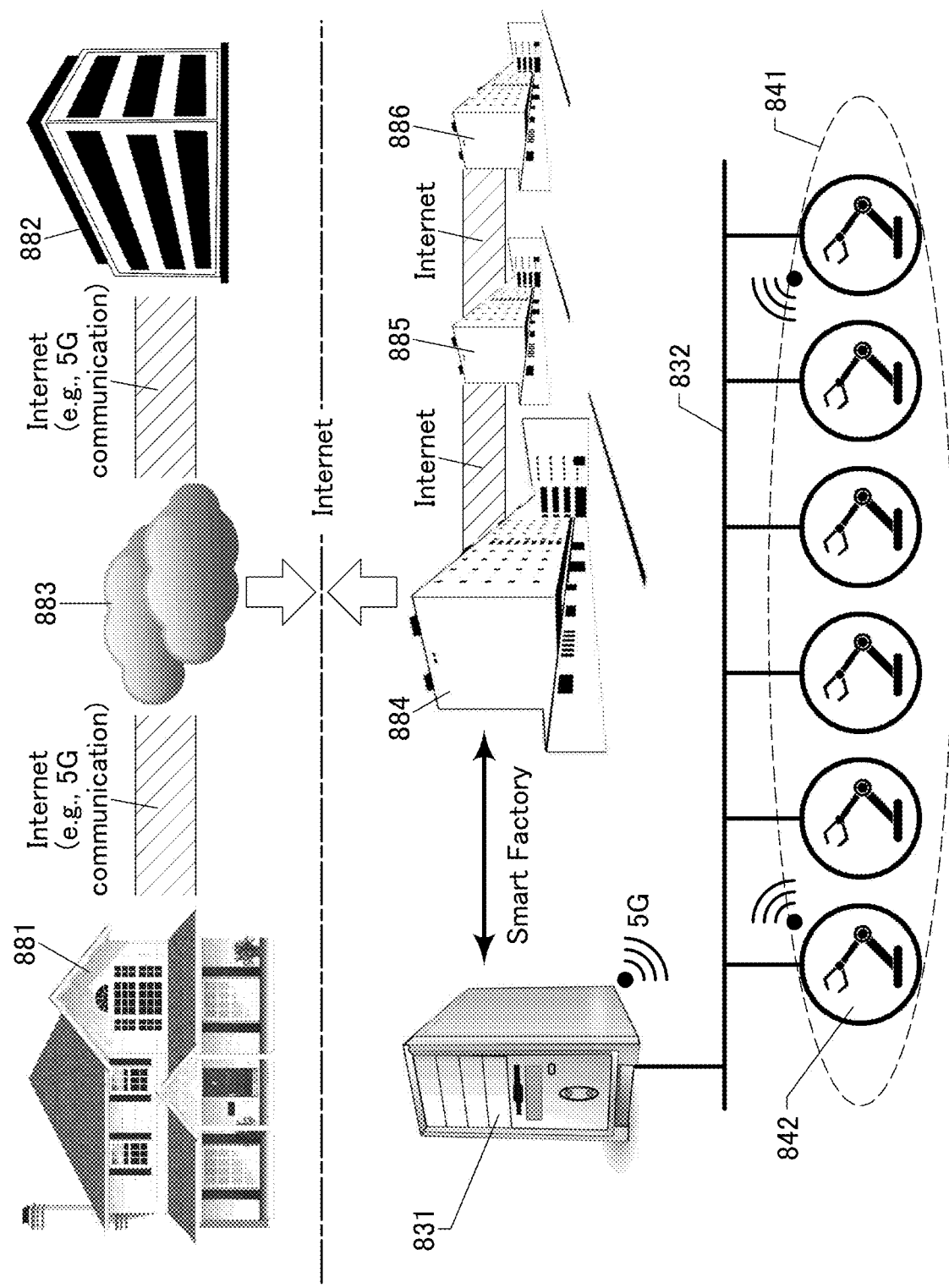
FIG. 25 is a conceptual diagram of factory automation.

FIG. 25 is a conceptual diagram of factory automation as an application example of the endpoint microcomputer. A factory 884 is connected to a cloud 883 through Internet connection. The cloud 883 is connected to a home 881 and an office 882 through Internet connection. The Internet connection may be wired communication or wireless communication. In the case of wireless communication, for example, wireless communication based on a communication standard such as the fourth-generation mobile communication system (4G) or the fifth-generation mobile communication system (5G) can be performed using the semiconductor device of one embodiment of the present invention for a communication device. The factory 884 may be connected to a factory 885 and a factory 886 through Internet connection.

The factory 884 includes a master device (control device) 831. The master device 831 is connected to the cloud 883 and has a function of transmitting and receiving data. The master device 831 is connected to a plurality of industrial robots 842 included in an IoT end device 841 through a M2M (Machine-to-Machine) interface 832. As the M2M interface 832, for example, industrial Ethernet ("Ethernet" is a registered trademark), which is a kind of wired communication, or local 5G, which is a kind of wireless communication, may be used.

A manager of the factory can check the operational status or the like from the home 881 or the office 882 connected to the factory 884 through the cloud 883. In addition, the manager can check wrong items and part shortage, instruct a storage space, and measure takt time, for example.

In recent years, IoT has been globally introduced into factories, under the name "Smart Factory". Smart Factory has been reported to enable not only simple examination and inspection by an endpoint microcomputer but also detection of failures and prediction of abnormality, for example.

The total power consumption of a small-scale system such as an endpoint microcomputer during operation is often small, which enhances the power reduction effect in a standby state by the Noff CPU. Although the embedded field of IoT sometimes requires quick response, the use of the Noff CPU achieves high-speed return from a standby state.

The composition, structure, method, and the like described in this embodiment can be used in combination as appropriate with the compositions, structures, methods, and the like described in the other embodiments, the example, and the like.

(Notes on Description of this Specification and the Like)

The description of the above embodiments and each structure in the embodiments are noted below.

One embodiment of the present invention can be constituted by combining, as appropriate, the structure described in each embodiment with any of the structures described in the other embodiments and Example. In addition, in the case where a plurality of structure examples are described in one embodiment, the structure examples can be combined as appropriate.

Note that content (or part thereof) described in one embodiment can be applied to, combined with, or replaced with another content (or part thereof) described in the embodiment and/or content (or part thereof) described in another embodiment or other embodiments.

Note that in each embodiment, content described in the embodiment is content described using a variety of drawings or content described with text disclosed in the specification.

Note that by combining a drawing (or part thereof) described in one embodiment with another part of the drawing, a different drawing (or part thereof) described in the embodiment, and/or a drawing (or part thereof) described in another embodiment or other embodiments, much more drawings can be created.

In addition, in this specification and the like, components are classified on the basis of the functions, and shown as blocks independent of one another in block diagrams. However, in an actual circuit or the like, it is difficult to separate components on the basis of the functions, and there are such a case where one circuit is associated with a plurality of functions and a case where a plurality of circuits are associated with one function. Therefore, blocks in the block diagrams are not limited by the components described in the specification, and the description can be changed appropriately depending on the situation.

Furthermore, in the drawings, the size, the layer thickness, or the region is shown with given magnitude for description convenience. Therefore, they are not limited to the illustrated scale. Note that the drawings are schematically shown for clarity, and embodiments of the present invention are not limited to shapes, values, or the like shown in the drawings. For example, fluctuation in signal, voltage, or current due to noise, fluctuation in signal, voltage, or current due to difference in timing, or the like can be included.

Furthermore, the positional relation between components illustrated in the drawings and the like is relative. Therefore, when the components are described with reference to drawings, terms for describing the positional relation, such as "over" and "under", may be used for convenience. The positional relation of the components is not limited to that described in this specification and can be explained with other terms as appropriate depending on the situation.

In this specification and the like, expressions "one of a source and a drain" (or a first electrode or a first terminal) and "the other of the source and the drain" (or a second electrode or a second terminal) are used in the description of the connection relation of a transistor. This is because the source and the drain of the transistor change depending on the structure, operating conditions, or the like of the transistor. Note that the source or the drain of the transistor can also be referred to as a source (drain) terminal, a source (drain) electrode, or the like as appropriate depending on the situation.

In addition, in this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

Furthermore, in this specification and the like, "voltage" and "potential" can be interchanged with each other as appropriate. The voltage refers to a potential difference from a reference potential, and when the reference potential is a ground voltage, for example, the voltage can be rephrased into the potential. The ground potential does not necessarily mean 0 V. Note that potentials are relative values, and a potential applied to a wiring or the like is sometimes changed depending on the reference potential.

In this specification and the like, a node can be referred to as a terminal, a wiring, an electrode, a conductive layer, a conductor, an impurity region, or the like depending on the circuit structure, the device structure, or the like. Furthermore, a terminal, a wiring, or the like can be referred to as a node.

In this specification and the like, the expression "A and B are connected" means the case where A and B are electrically connected. Here, the expression "A and B are electrically connected" means connection that enables electric signal transmission between A and B in the case where an object (that refers to an element such as a switch, a transistor element, or a diode, a circuit including the element and a wiring, or the like) exists between A and B. Note that the case where A and B are electrically connected includes the case where A and B are directly connected. Here, the expression "A and B are directly connected" means connection that enables electric signal transmission between A and B through a wiring (or an electrode) or the like, not through the above object. In other words, direct connection refers to connection that can be regarded as the same circuit diagram when indicated as an equivalent circuit.

In this specification and the like, a switch has a function of controlling whether current flows or not by being in a conduction state (an on state) or a non-conduction state (an off state). Alternatively, a switch has a function of selecting and changing a current path.

In this specification and the like, channel length refers to, for example, the distance between a source and a drain in a region where a semiconductor (or a portion where current flows in a semiconductor when a transistor is in an on state) and a gate overlap with each other or a region where a channel is formed in a top view of the transistor.

In this specification and the like, channel width refers to, for example, the length of a portion where a source and a drain face each other in a region where a semiconductor (or a portion where current flows in a semiconductor when a transistor is in an on state) and a gate electrode overlap with each other or a region where a channel is formed.

Note that in this specification and the like, the terms such as "film" and "layer" can be interchanged with each other depending on the case or according to circumstances. For example, the term "conductive layer" can be changed into the term "conductive film" in some cases. As another example, the term "insulating film" can be changed into the term "insulating layer" in some cases.

REFERENCE NUMERALS

10: wireless communication device, 11: application processor, 12: baseband processor, 13: integrated circuit, 14: memory, 15: battery, 16: power management IC, 17: display portion, 18: camera portion, 19: operation input portion, 20: audio IC, 21: microphone, 22: speaker, 23: semiconductor device, 24: control circuit, 31: coil, 32: coil, 33: capacitor, 35: transistor, 36: transistor, 40: frequency correction circuit, 41: capacitor, 42: capacitor, 43: transistor, 43A: transistor, 43B: transistor, 44: transistor, 45: transistor, 46: transistor, 47: transistor, 48: transistor, 48A: transistor, 48B: transistor, 49: switching circuit, 50: oscillation circuit, 51: substrate, 52: wiring, 61: layer, 71: differential amplifier circuit, 72: offset correction circuit, 73: transistor, 73A: transistor, 74: transistor, 75: transistor, 75A: transistor, 76: transistor, 76B: transistor, 77: capacitor, 78: capacitor, 79: constant current circuit, 81: comparator, 82: signal generation circuit, 83: transistor, 85: transistor, 87: capacitor, 101: low noise amplifier, 102: mixer, 103: low-pass filter, 104: variable gain amplifier, 105: analog-digital converter circuit, 106: interface portion, 107: digital-analog converter circuit, 108: variable gain amplifier, 109: low-pass filter, 110: mixer, 111: power amplifier, 311: substrate, 313: semiconductor region, 314*a*: low-resistance region, 314*b*: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 404: insulator, 500: transistor, 500A: transistor, 500B: transistor, 503: conductor, 503a: conductor, 503b: conductor, 510: insulator, 512: insulator, 513: insulator, 514: insulator, 516: insulator, 518: conductor, 520: insulator, 522: insulator, 524: insulator, 526: insulator, 530: oxide, 530a: oxide, 530b: oxide, 540a: conductor, 540b: conductor, 542: conductor, 542a: conductor, 542b: conductor, 543a: region, 543b: region, 544: insulator, 545: insulator, 546: conductor, 548: conductor, 550: transistor, 552: insulator, 560: conductor, 560a: conductor, 560b: conductor, 574: insulator, 580: insulator, 581: insulator, 582: insulator, 586: insulator, 600: capacitor, 609: operation input portion, 610: conductor, 612: conductor, 620: conductor, 630: insulator, 640: insulator, 711: substrate, 712: circuit region, 713: separation region, 714: separation line, 715: chip, 750: electronic component, 752: printed circuit board, 753: semiconductor device, 754: circuit board, 755: lead, 801: cloud field, 802: field, 804: power consumption, 805: processing performance, 831: master device, 832: interface, 841: IoT end device, 842: industrial robot, 881: home, 882: office, 883: cloud, 884: factory, 885: factory, 886: factory, 6100: mobile information terminal, 6101: housing, 6102: display portion, 6103: band, 6105: operation button, 6200: mobile information terminal, 6201: housing, 6202: display portion, 6203: operation button, 6204: speaker, 6205: microphone, 6209: fingerprint sensor, 6300: cleaning robot, 6301: housing, 6302: display portion, 6303: camera, 6304: brush, 6305: operation button, 6310: dust, 6400: robot, 6401: illuminance sensor, 6402: microphone, 6403: upper camera, 6404: speaker, 6405: display portion, 6406: lower camera, 6407: obstacle sensor, 6408: moving mechanism, 6409: arithmetic device, 6500: flying object, 6501: propeller, 6502: camera, 6503: battery, 6504: electronic component, 7160: automobile, 8000: display device, 8001: housing, 8002: display portion, 8003: speaker portion, 8004: semiconductor device, 8005: power storage device, 8100: lighting device, 8101: housing, 8102: light source, 8103: semiconductor device, 8104: ceiling, 8105: power storage device, 8200: indoor unit, 8201: housing, 8202: air outlet, 8203: semiconductor device, 8204: outdoor unit, 8205: power storage device, 8300: electric refrigerator-freezer, 8301: housing, 8302: refrigerator door, 8303: freezer door, 8304: semiconductor device, 8305: power storage device, 8405: wall, 8406: floor, 8407: window

The invention claimed is:

1. A semiconductor device comprising:
an oscillation circuit comprising a first coil, a second coil, a first capacitor, a second capacitor, a first transistor, and a second transistor; and
a frequency correction circuit comprising a third capacitor, a fourth capacitor, a third transistor, a fourth transistor, and a switching circuit,
wherein the switching circuit is configured to control a conduction state or a non-conduction state of the third transistor and the fourth transistor,
wherein the frequency correction circuit is provided above the oscillation circuit and is configured to adjust an oscillation frequency of the oscillation circuit,
wherein the first transistor and the second transistor each comprise a semiconductor layer comprising silicon in a channel formation region, and
wherein the third transistor and the fourth transistor each comprise a semiconductor layer comprising an oxide semiconductor in a channel formation region.

2. The semiconductor device according to claim 1,
wherein the switching circuit comprises a fifth transistor to an eighth transistor, and
wherein the fifth transistor to the eighth transistor each comprise a semiconductor layer comprising an oxide semiconductor in a channel formation region.

3. The semiconductor device according to claim 2,
wherein the fifth transistor is configured to control a conduction state or a non-conduction state between a gate of the third transistor and the third capacitor,
wherein the sixth transistor is configured to control a conduction state or a non-conduction state between a gate of the fourth transistor and the fourth capacitor,
wherein the seventh transistor is configured to control a conduction state or a non-conduction state between the gate of the third transistor and a wiring supplying a low power supply potential, and
wherein the eighth transistor is configured to control a conduction state or a non-conduction state between the gate of the fourth transistor and the wiring supplying the low power supply potential.

4. A wireless communication device comprising:
an integrated circuit comprising an antenna, a mixer, an oscillator, and an analog-digital converter circuit,
wherein the oscillator comprises:
an oscillation circuit comprising a first coil, a second coil, a first capacitor, a second capacitor, a first transistor, and a second transistor; and
a frequency correction circuit comprising a third capacitor, a fourth capacitor, a third transistor, a fourth transistor, and a switching circuit,
wherein the switching circuit is configured to control a conduction state or a non-conduction state of the third transistor and the fourth transistor,
wherein the frequency correction circuit is provided above the oscillation circuit and is configured to adjust an oscillation frequency of the oscillation circuit,
wherein the first transistor and the second transistor each comprise a semiconductor layer comprising silicon in a channel formation region, and
wherein the third transistor and the fourth transistor each comprise a semiconductor layer comprising an oxide semiconductor in a channel formation region.

5. The wireless communication device according to claim 4,
wherein the switching circuit comprises a fifth transistor to an eighth transistor, and
wherein the fifth transistor to the eighth transistor each comprise a semiconductor layer comprising an oxide semiconductor in a channel formation region.

6. The wireless communication device according to claim 5,
wherein the fifth transistor is configured to control a conduction state or a non-conduction state between a gate of the third transistor and the third capacitor,
wherein the sixth transistor is configured to control a conduction state or a non-conduction state between a gate of the fourth transistor and the fourth capacitor,
wherein the seventh transistor is configured to control a conduction state or a non-conduction state between the gate of the third transistor and a wiring supplying a low power supply potential, and
wherein the eighth transistor is configured to control a conduction state or a non-conduction state between the gate of the fourth transistor and the wiring supplying the low power supply potential.

7. The wireless communication device according to claim 4,
wherein the analog-digital converter circuit comprises a comparison circuit,
wherein the comparison circuit comprises a differential amplifier circuit and an offset correction circuit,
wherein the differential amplifier circuit comprises an output terminal and an inverted output terminal,
wherein the offset correction circuit comprises a constant current circuit and a ninth transistor to a twelfth transistor,
wherein one of a source and a drain of the ninth transistor is electrically connected to the output terminal,
wherein one of a source and a drain of the tenth transistor is electrically connected to the inverted output terminal,
wherein one of a source and a drain of the eleventh transistor is electrically connected to a gate of the ninth transistor,
wherein one of a source and a drain of the twelfth transistor is electrically connected to a gate of the tenth transistor, and
wherein the eleventh transistor and the twelfth transistor each comprise a semiconductor layer comprising an oxide semiconductor in a channel formation region.

* * * * *